United States Patent
Sreenivasan et al.

(10) Patent No.: US 8,349,241 B2
(45) Date of Patent: Jan. 8, 2013

(54) METHOD TO ARRANGE FEATURES ON A SUBSTRATE TO REPLICATE FEATURES HAVING MINIMAL DIMENSIONAL VARIABILITY

(75) Inventors: Sidlgata V. Sreenivasan, Austin, TX (US); Michael P. C. Watts, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 2406 days.

(21) Appl. No.: 10/264,960

(22) Filed: Oct. 4, 2002

(65) Prior Publication Data

US 2004/0065976 A1    Apr. 8, 2004

(51) Int. Cl.
 B29C 35/00    (2006.01)
 B29C 43/00    (2006.01)
(52) U.S. Cl. .......................................... 264/319; 216/44
(58) Field of Classification Search .................. 264/319, 264/320, 171.1, 496; 216/44; 425/174.4, 425/385, 808, 810
See application file for complete search history.

(56) References Cited

U.S. PATENT DOCUMENTS

| | | |
|---|---|---|
| 3,527,062 A | 9/1970 | Bilinski et al. |
| 3,783,520 A | 1/1974 | King |
| 3,807,027 A | 4/1974 | Heisler |
| 3,807,029 A | 4/1974 | Troeger |
| 3,811,665 A | 5/1974 | Seelig |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,208,240 A | 6/1980 | Latos |
| 4,267,212 A | 5/1981 | Sakawaki |
| 4,326,805 A | 4/1982 | Feldman et al. |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |

(Continued)

FOREIGN PATENT DOCUMENTS

DE    2800476    7/1978

(Continued)

OTHER PUBLICATIONS

Abstract of Japanese Patent 63-138730.

(Continued)

Primary Examiner — Mathieu D. Vargot
(74) Attorney, Agent, or Firm — Cameron A. King

(57) ABSTRACT

The present invention is directed to a method of and a mold for arranging features on a substrate to replicate the features with minimal dimensional variability. The method includes arranging features on a layer to minimize thickness variations in the layer that are attributable to density variations of the plurality of features on the layer. The features are transferred into an underlying substrate. It is believed that by forming the features so as to define a uniform fill factor in the layer, the thickness variations may be reduced, if not abrogated. To that end, one method in accordance with the present invention includes forming a flowable material on the substrate. Thereafter, a plurality of features is formed in a region of the flowable material. The plurality of features are arranged to provide a substantially uniform fill factor in the region.

14 Claims, 5 Drawing Sheets

U.S. PATENT DOCUMENTS

| | | | |
|---|---|---|---|
| 4,440,804 A | 4/1984 | Milgram | |
| 4,451,507 A | 5/1984 | Beltz et al. | |
| 4,507,331 A | 3/1985 | Hiraoka | |
| 4,544,572 A | 10/1985 | Sandvig et al. | |
| 4,552,832 A | 11/1985 | Blume et al. | |
| 4,552,833 A | 11/1985 | Ito et al. | |
| 4,576,900 A | 3/1986 | Chiang | |
| 4,600,309 A | 7/1986 | Fay | |
| 4,610,442 A | 9/1986 | Oku et al. | |
| 4,638,669 A | 1/1987 | Chou | |
| 4,657,845 A | 4/1987 | Frechet et al. | |
| 4,676,868 A | 6/1987 | Riley et al. | |
| 4,692,205 A | 9/1987 | Sachdev et al. | |
| 4,694,703 A | 9/1987 | Routson | |
| 4,707,218 A | 11/1987 | Giammarco et al. | |
| 4,707,611 A | 11/1987 | Southwell | |
| 4,722,878 A | 2/1988 | Watakabe et al. | |
| 4,724,222 A | 2/1988 | Feldman | |
| 4,731,155 A | 3/1988 | Napoli et al. | |
| 4,737,425 A | 4/1988 | Lin et al. | |
| 4,763,886 A | 8/1988 | Takei | |
| 4,772,878 A | 9/1988 | Kane | |
| 4,776,695 A | 10/1988 | van Pham et al. | |
| 4,808,511 A | 2/1989 | Holmes | |
| 4,826,943 A | 5/1989 | Ito et al. | |
| 4,846,931 A | 7/1989 | Gmitter et al. | |
| 4,848,179 A | 7/1989 | Ubhayakar | |
| 4,848,911 A | 7/1989 | Uchida et al. | |
| 4,857,477 A | 8/1989 | Kanamori | |
| 4,862,019 A | 8/1989 | Ashmore, Jr. | |
| 4,866,307 A | 9/1989 | Ashmore, Jr. | |
| 4,883,561 A | 11/1989 | Gmitter et al. | |
| 4,887,283 A | 12/1989 | Hosono | |
| 4,891,303 A | 1/1990 | Garza et al. | |
| 4,908,298 A | 3/1990 | Hefferon et al. | |
| 4,909,151 A | 3/1990 | Fukui et al. | |
| 4,919,748 A | 4/1990 | Bredbenner et al. | |
| 4,921,778 A | 5/1990 | Thackeray et al. | |
| 4,929,083 A | 5/1990 | Brunner | |
| 4,931,351 A | 6/1990 | McColgin et al. | |
| 4,959,252 A | 9/1990 | Bonnebat et al. | |
| 4,964,145 A | 10/1990 | Maldonado | |
| 4,964,945 A | 10/1990 | Calhoun | |
| 4,976,818 A | 12/1990 | Hashimoto et al. | |
| 4,980,316 A | 12/1990 | Huebner | |
| 4,999,280 A | 3/1991 | Hiraoka | |
| 5,003,062 A | 3/1991 | Yen | |
| 5,024,722 A | 6/1991 | Cathey, Jr. | |
| 5,048,960 A | 9/1991 | Hayashi et al. | |
| 5,053,318 A | 10/1991 | Gulla et al. | |
| 5,063,321 A | 11/1991 | Carter | |
| 5,071,694 A | 12/1991 | Uekita et al. | |
| 5,072,126 A | 12/1991 | Progler | |
| 5,073,230 A | 12/1991 | Maracas et al. | |
| 5,074,667 A | 12/1991 | Miyatake | |
| 5,108,875 A | 4/1992 | Thackeray et al. | |
| 5,110,514 A | 5/1992 | Soane | |
| 5,126,006 A | 6/1992 | Cronin et al. | |
| 5,148,036 A | 9/1992 | Matsugu et al. | |
| 5,148,037 A | 9/1992 | Suda et al. | |
| 5,151,754 A | 9/1992 | Ishibashi et al. | |
| 5,155,749 A | 10/1992 | DiMilia et al. | |
| 5,160,402 A | 11/1992 | Cheng | |
| 5,169,494 A | 12/1992 | Hashimoto et al. | |
| 5,171,490 A | 12/1992 | Fudim | |
| 5,173,393 A | 12/1992 | Sezi et al. | |
| 5,179,863 A | 1/1993 | Uchida et al. | |
| 5,198,326 A | 3/1993 | Hashimoto et al. | |
| 5,204,381 A | 4/1993 | Zeigler | |
| 5,204,739 A | 4/1993 | Domenicali | |
| 5,206,983 A | 5/1993 | Guckel et al. | |
| 5,212,147 A | 5/1993 | Sheats | |
| 5,218,193 A | 6/1993 | Miyatake | |
| 5,232,874 A | 8/1993 | Rhodes et al. | |
| 5,234,793 A | 8/1993 | Sebald et al. | |
| 5,240,550 A | 8/1993 | Boehnke et al. | |
| 5,240,878 A | 8/1993 | Fitzsimmons et al. | |
| 5,242,711 A | 9/1993 | DeNatale et al. | |
| 5,244,818 A | 9/1993 | Jokerst et al. | |
| 5,250,472 A | 10/1993 | Chen et al. | |
| 5,259,926 A | 11/1993 | Kuwabara et al. | |
| 5,270,222 A | 12/1993 | Moslehi | |
| 5,270,984 A | 12/1993 | Mine | |
| 5,277,749 A | 1/1994 | Griffith et al. | |
| 5,314,772 A | 5/1994 | Kozicki et al. | |
| 5,318,870 A | 6/1994 | Hartney | |
| 5,324,012 A | 6/1994 | Aoyama et al. | |
| 5,324,683 A | 6/1994 | Fitch et al. | |
| 5,328,810 A | 7/1994 | Lowrey et al. | |
| 5,330,881 A | 7/1994 | Sidman et al. | |
| 5,335,066 A | 8/1994 | Yamada et al. | |
| 5,348,616 A | 9/1994 | Hartman et al. | |
| 5,355,219 A | 10/1994 | Araki et al. | |
| 5,357,122 A | 10/1994 | Okubora et al. | |
| 5,362,606 A | 11/1994 | Hartney et al. | |
| 5,366,851 A | 11/1994 | Novembre | |
| 5,374,327 A | 12/1994 | Imahashi et al. | |
| 5,374,454 A | 12/1994 | Bickford et al. | |
| 5,376,810 A | 12/1994 | Hoenk et al. | |
| 5,380,474 A | 1/1995 | Rye et al. | |
| 5,386,119 A | 1/1995 | Ledger | |
| 5,392,123 A | 2/1995 | Marcus et al. | |
| 5,403,433 A | 4/1995 | Morrison et al. | |
| 5,405,492 A | 4/1995 | Moslehi | |
| 5,414,514 A | 5/1995 | Smith et al. | |
| 5,417,802 A | 5/1995 | Obeng | |
| 5,421,981 A | 6/1995 | Leader et al. | |
| 5,422,295 A | 6/1995 | Choi et al. | |
| 5,424,549 A | 6/1995 | Feldman | |
| 5,425,848 A | 6/1995 | Haisma et al. | |
| 5,425,964 A | 6/1995 | Southwell et al. | |
| 5,431,777 A | 7/1995 | Austin et al. | |
| 5,434,107 A | 7/1995 | Paranjpe | |
| 5,439,766 A | 8/1995 | Day et al. | |
| 5,452,090 A | 9/1995 | Progler et al. | |
| 5,453,157 A | 9/1995 | Jeng | |
| 5,458,520 A | 10/1995 | DeMercurio et al. | |
| 5,461,246 A | 10/1995 | Chou | |
| 5,468,542 A | 11/1995 | Crouch | |
| 5,480,047 A | 1/1996 | Tanigawa et al. | |
| 5,487,811 A | 1/1996 | Iizuka | |
| 5,493,401 A | 2/1996 | Horie et al. | |
| 5,504,793 A | 4/1996 | Chen | |
| 5,507,411 A | 4/1996 | Peckels | |
| 5,508,527 A | 4/1996 | Kuroda et al. | |
| 5,512,131 A | 4/1996 | Kumar et al. | |
| 5,515,167 A | 5/1996 | Ledger et al. | |
| 5,523,878 A | 6/1996 | Wallace et al. | |
| 5,527,662 A | 6/1996 | Hashimoto et al. | |
| 5,539,552 A | 7/1996 | Desai et al. | |
| 5,545,367 A | 8/1996 | Bae et al. | |
| 5,563,684 A | 10/1996 | Stagaman | |
| 5,563,702 A | 10/1996 | Emery et al. | |
| 5,565,114 A | 10/1996 | Saito et al. | |
| 5,566,584 A | 10/1996 | Briganti | |
| 5,625,193 A | 4/1997 | Broude et al. | |
| 5,628,917 A | 5/1997 | MacDonald et al. | |
| 5,633,505 A | 5/1997 | Chung et al. | |
| 5,643,364 A | 7/1997 | Zhao et al. | |
| 5,654,238 A | 8/1997 | Cronin et al. | |
| 5,669,303 A | 9/1997 | Maracas et al. | |
| 5,670,415 A | 9/1997 | Rust | |
| 5,686,993 A | 11/1997 | Kokubo et al. | |
| 5,694,207 A | 12/1997 | Hung et al. | |
| 5,700,626 A | 12/1997 | Lee et al. | |
| 5,719,495 A | 2/1998 | Moslehi | |
| 5,723,176 A | 3/1998 | Keyworth et al. | |
| 5,724,145 A | 3/1998 | Kondo et al. | |
| 5,725,788 A | 3/1998 | Maracas et al. | |
| 5,726,548 A | 3/1998 | Chiba et al. | |
| 5,731,981 A | 3/1998 | Simard | |
| 5,736,424 A | 4/1998 | Prybyla et al. | |
| 5,737,064 A | 4/1998 | Inoue et al. | |
| 5,743,998 A | 4/1998 | Park | |
| 5,747,102 A | 5/1998 | Smith et al. | |
| 5,753,014 A | 5/1998 | Van Rijn | |
| 5,760,500 A | 6/1998 | Kondo et al. | |

| | | |
|---|---|---|
| 5,772,905 A * | 6/1998 | Chou .................... 216/44 |
| 5,779,799 A | 7/1998 | Davis |
| 5,785,918 A | 7/1998 | Hull |
| 5,802,914 A | 9/1998 | Fassler et al. |
| 5,804,474 A | 9/1998 | Sakaki et al. |
| 5,808,742 A | 9/1998 | Everett et al. |
| 5,817,579 A | 10/1998 | Ko et al. |
| 5,820,769 A | 10/1998 | Chou |
| 5,825,482 A | 10/1998 | Nikoonahad et al. |
| 5,837,892 A | 11/1998 | Cavallaro et al. |
| 5,855,686 A | 1/1999 | Rust |
| 5,876,550 A | 3/1999 | Feygin et al. |
| 5,877,032 A | 3/1999 | Guinn et al. |
| 5,877,036 A | 3/1999 | Kawai |
| 5,877,861 A | 3/1999 | Ausschnitt et al. |
| 5,884,292 A | 3/1999 | Baker et al. |
| 5,885,472 A | 3/1999 | Miyazaki et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,912,049 A | 6/1999 | Shirley |
| 5,926,690 A | 7/1999 | Toprac et al. |
| 5,937,758 A | 8/1999 | Maracas et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblit et al. |
| 5,952,127 A | 9/1999 | Yamanaka |
| 5,956,216 A | 9/1999 | Chou |
| 5,983,906 A | 11/1999 | Zhao et al. |
| 5,988,859 A | 11/1999 | Kirk |
| 5,999,245 A | 12/1999 | Suzuki |
| 6,016,696 A | 1/2000 | Bair et al. |
| 6,019,166 A | 2/2000 | Viswanath et al. |
| 6,033,977 A | 3/2000 | Gutsche et al. |
| 6,035,805 A | 3/2000 | Rust |
| 6,036,055 A | 3/2000 | Mogadam et al. |
| 6,038,280 A | 3/2000 | Rossiger et al. |
| 6,039,897 A | 3/2000 | Lochhead et al. |
| 6,046,056 A | 4/2000 | Parce et al. |
| 6,048,799 A | 4/2000 | Prybyla |
| 6,051,345 A | 4/2000 | Huang |
| 6,052,183 A | 4/2000 | Lee |
| 6,066,269 A | 5/2000 | Wei et al. |
| 6,068,783 A | 5/2000 | Szetsen |
| 6,069,380 A | 5/2000 | Chou et al. |
| 6,074,827 A | 6/2000 | Nelson et al. |
| 6,081,334 A | 6/2000 | Brimbergen et al. |
| 6,088,103 A | 7/2000 | Everett et al. |
| 6,091,485 A | 7/2000 | Li et al. |
| 6,096,655 A | 8/2000 | Lee et al. |
| 6,112,588 A | 9/2000 | Cavallaro et al. |
| 6,117,708 A | 9/2000 | Wensel |
| 6,125,183 A | 9/2000 | Jiawook et al. |
| 6,128,085 A | 10/2000 | Buermann et al. |
| 6,133,576 A | 10/2000 | Shafer et al. |
| 6,137,562 A | 10/2000 | Masuyuki et al. |
| 6,143,412 A | 11/2000 | Schueller et al. |
| 6,150,231 A | 11/2000 | Muller et al. |
| 6,150,680 A | 11/2000 | Eastman et al. |
| 6,159,400 A | 12/2000 | Laquer |
| 6,168,845 B1 | 1/2001 | Fontana, Jr. et al. |
| 6,180,239 B1 | 1/2001 | Whitesides et al. |
| 6,182,042 B1 | 1/2001 | Peevers |
| 6,188,150 B1 | 2/2001 | Spence |
| 6,190,929 B1 | 2/2001 | Wang et al. |
| 6,204,922 B1 | 3/2001 | Chalmers |
| 6,218,316 B1 | 4/2001 | Marsh |
| 6,220,561 B1 | 4/2001 | Garcia |
| 6,234,379 B1 | 5/2001 | Donges |
| 6,242,363 B1 | 6/2001 | Zhang |
| 6,245,213 B1 | 6/2001 | Olsson et al. |
| 6,245,581 B1 | 6/2001 | Bonser et al. |
| 6,274,294 B1 | 8/2001 | Hines |
| 6,278,519 B1 | 8/2001 | Rosencwaig et al. |
| 6,278,809 B1 | 8/2001 | Johnson et al. |
| 6,297,880 B1 | 10/2001 | Rosencwaig et al. |
| 6,304,326 B1 | 10/2001 | Aspnes et al. |
| 6,309,580 B1 | 10/2001 | Chou |
| 6,316,290 B1 | 11/2001 | Wensel |
| 6,326,627 B1 | 12/2001 | Putvinski et al. |
| 6,329,256 B1 | 12/2001 | Ibok |
| 6,334,960 B1 * | 1/2002 | Willson et al. .................. 216/52 |
| 6,335,149 B1 | 1/2002 | Xu et al. |
| 6,337,262 B1 | 1/2002 | Pradeep et al. |
| 6,355,198 B1 | 3/2002 | Kim et al. |
| 6,361,831 B1 | 3/2002 | Sato et al. |
| 6,376,379 B1 | 4/2002 | Quek et al. |
| 6,383,888 B1 | 5/2002 | Stirton |
| 6,383,928 B1 | 5/2002 | Eissa |
| 6,387,783 B1 | 5/2002 | Furukawa et al. |
| 6,387,787 B1 | 5/2002 | Mancini et al. |
| 6,388,253 B1 | 5/2002 | Su |
| 6,391,217 B1 | 5/2002 | Schaffer et al. |
| 6,391,798 B1 | 5/2002 | DeFelice et al. |
| 6,407,340 B1 | 6/2002 | Wikstrom et al. |
| 6,411,010 B1 | 6/2002 | Suzuki et al. |
| 6,420,892 B1 | 7/2002 | Krivy et al. |
| 6,423,207 B1 | 7/2002 | Heidari et al. |
| 6,426,288 B1 | 7/2002 | Meikle |
| 6,437,891 B1 | 8/2002 | Chandrasekhar et al. |
| 6,444,542 B2 | 9/2002 | Moise et al. |
| 6,447,919 B1 | 9/2002 | Brown et al. |
| 6,455,411 B1 | 9/2002 | Jiang et al. |
| 6,467,761 B1 | 10/2002 | Amatucci et al. |
| 6,468,642 B1 | 10/2002 | Bray et al. |
| 6,482,742 B1 | 11/2002 | Chou |
| 6,489,068 B1 | 12/2002 | Kye |
| 6,495,624 B1 | 12/2002 | Brown |
| 6,495,907 B1 | 12/2002 | Jain et al. |
| 6,510,356 B2 | 1/2003 | Seshan |
| 6,514,672 B2 | 2/2003 | Young et al. |
| 6,517,977 B2 | 2/2003 | Resnick et al. |
| 6,518,168 B1 | 2/2003 | Clem et al. |
| 6,518,189 B1 | 2/2003 | Chou |
| 6,521,324 B1 | 2/2003 | Debe et al. |
| 6,521,536 B1 | 2/2003 | Robinson |
| 6,522,411 B1 | 2/2003 | Moon et al. |
| 6,534,418 B1 | 3/2003 | Plat et al. |
| 6,539,286 B1 | 3/2003 | Jiang |
| 6,541,356 B2 | 4/2003 | Fogel et al. |
| 6,541,360 B1 | 4/2003 | Lyons et al. |
| 6,561,706 B2 | 5/2003 | Singh et al. |
| 6,565,928 B2 | 5/2003 | Sakamoto et al. |
| 6,580,172 B2 | 6/2003 | Mancini et al. |
| 6,580,505 B1 | 6/2003 | Bareket |
| 6,586,268 B1 | 7/2003 | Kopola et al. |
| 6,588,632 B1 | 7/2003 | Nicol |
| 6,593,240 B1 | 7/2003 | Page |
| 6,600,207 B2 | 7/2003 | Huang et al. |
| 6,600,969 B2 | 7/2003 | Sudolcan et al. |
| 6,602,721 B2 | 8/2003 | Mikawa et al. |
| 6,603,538 B1 | 8/2003 | Oluseyi et al. |
| 6,627,544 B2 | 9/2003 | Izumi et al. |
| 6,629,292 B1 | 9/2003 | Corson et al. |
| 6,630,283 B1 | 10/2003 | Simpson et al. |
| 6,630,410 B2 | 10/2003 | Trapp et al. |
| 6,632,742 B2 | 10/2003 | Yang et al. |
| 6,633,391 B1 | 10/2003 | Oluseyi et al. |
| 6,635,581 B2 | 10/2003 | Wong |
| 6,636,311 B1 | 10/2003 | Ina et al. |
| 6,646,662 B1 | 11/2003 | Nebashi et al. |
| 6,665,014 B1 | 12/2003 | Assadi et al. |
| 6,676,261 B2 | 1/2004 | Mullen et al. |
| 6,677,252 B2 | 1/2004 | Marsh |
| 6,696,157 B1 | 2/2004 | David et al. |
| 6,696,220 B2 | 2/2004 | Bailey et al. |
| 6,703,190 B2 | 3/2004 | Elian et al. |
| 6,713,238 B1 | 3/2004 | Chou et al. |
| 6,716,767 B2 | 4/2004 | Shih et al. |
| 6,719,915 B2 | 4/2004 | Willson et al. |
| 6,730,256 B1 | 5/2004 | Bloomstein et al. |
| 6,737,202 B2 | 5/2004 | Gehoski et al. |
| 6,743,713 B2 | 6/2004 | Mukherjee-Roy et al. |
| 6,753,972 B1 | 6/2004 | Hirose et al. |
| 6,767,983 B1 | 7/2004 | Fujiyama et al. |
| 6,770,852 B1 | 8/2004 | Steger |

| | | |
|---|---|---|
| 6,776,094 B1 | 8/2004 | Whitesides et al. |
| 6,777,170 B1 | 8/2004 | Bloomstein et al. |
| 6,797,384 B2 | 9/2004 | Gasworth et al. |
| 6,805,054 B1 | 10/2004 | Meissl et al. |
| 6,809,356 B2 | 10/2004 | Chou |
| 6,819,426 B2 | 11/2004 | Sezginer et al. |
| 6,828,244 B2 | 12/2004 | Chou |
| 6,831,712 B1 | 12/2004 | Stephenson et al. |
| 6,833,325 B2 | 12/2004 | Huang et al. |
| 6,842,229 B2 | 1/2005 | Sreenivasan et al. |
| 2001/0023829 A1 | 9/2001 | Olsson et al. |
| 2002/0018190 A1 | 2/2002 | Nogawa et al. |
| 2002/0042027 A1 | 4/2002 | Chou et al. |
| 2002/0069525 A1 | 6/2002 | Hada et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0108929 A1 | 8/2002 | Ho et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0150398 A1 | 10/2002 | Choi et al. |
| 2002/0167117 A1 | 11/2002 | Chou |
| 2002/0175298 A1 | 11/2002 | Moniwa et al. |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0113638 A1 | 6/2003 | Mancini et al. |
| 2003/0129542 A1 | 7/2003 | Shih et al. |
| 2003/0133126 A1 | 7/2003 | Sarfaty et al. |
| 2003/0170995 A1 | 9/2003 | Chou |
| 2003/0170996 A1 | 9/2003 | Chou |
| 2003/0179354 A1 | 9/2003 | Araki et al. |
| 2003/0205657 A1 | 11/2003 | Voisin |
| 2003/0205658 A1 | 11/2003 | Voisin |
| 2003/0215577 A1 | 11/2003 | Willson et al. |
| 2003/0223670 A1 | 12/2003 | Nikolov et al. |
| 2003/0224116 A1 | 12/2003 | Chen et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0008742 A1 | 1/2004 | Chou et al. |
| 2004/0009673 A1 | 1/2004 | Sreenivasan et al. |
| 2004/0010341 A1 | 1/2004 | Watts et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0033515 A1 | 2/2004 | Cao et al. |
| 2004/0036201 A1 | 2/2004 | Chou et al. |
| 2004/0038552 A1 | 2/2004 | Watts et al. |
| 2004/0046271 A1 | 3/2004 | Watts |
| 2004/0046288 A1 | 3/2004 | Chou |
| 2004/0053146 A1 | 3/2004 | Sreenivasan et al. |
| 2004/0065252 A1 | 4/2004 | Sreenivasan et al. |
| 2004/0065976 A1 | 4/2004 | Sreenivasan et al. |
| 2004/0086793 A1 | 5/2004 | Sreenivasan et al. |
| 2004/0089979 A1 | 5/2004 | Rubin |
| 2004/0090611 A1 | 5/2004 | Choi et al. |
| 2004/0104641 A1 | 6/2004 | Choi et al. |
| 2004/0112153 A1 | 6/2004 | Choi et al. |
| 2004/0112861 A1 | 6/2004 | Choi et al. |
| 2004/0112862 A1 | 6/2004 | Willson et al. |
| 2004/0116548 A1 | 6/2004 | Willson et al. |
| 2004/0118809 A1 | 6/2004 | Chou et al. |
| 2004/0120644 A1 | 6/2004 | Chou et al. |
| 2004/0122862 A1 | 6/2004 | Todd |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0141163 A1 | 7/2004 | Bailey et al. |
| 2004/0146792 A1 | 7/2004 | Nimmakayala et al. |
| 2004/0149687 A1 | 8/2004 | Choi et al. |
| 2004/0150129 A1 | 8/2004 | Hougham et al. |
| 2004/0156108 A1 | 8/2004 | Chou et al. |
| 2004/0163563 A1 | 8/2004 | Sreenivasan et al. |
| 2004/0168586 A1 | 9/2004 | Bailey et al. |
| 2004/0168588 A1 | 9/2004 | Choi et al. |
| 2004/0168613 A1 | 9/2004 | Nguyen et al. |
| 2004/0169441 A1 | 9/2004 | Choi et al. |
| 2004/0170012 A1 | 9/2004 | Huang et al. |
| 2004/0170770 A1 | 9/2004 | Nguyen et al. |
| 2004/0170771 A1 | 9/2004 | Bailey et al. |
| 2004/0188381 A1 | 9/2004 | Sreenivasan |
| 2004/0189994 A1 | 9/2004 | Sreenivasan et al. |
| 2004/0189996 A1 | 9/2004 | Sreenivasan et al. |
| 2004/0191989 A1 | 9/2004 | Ngo et al. |
| 2004/0192041 A1 | 9/2004 | Jeong et al. |
| 2004/0197843 A1 | 10/2004 | Chou et al. |
| 2004/0200411 A1 | 10/2004 | Willson et al. |
| 2004/0202865 A1 | 10/2004 | Homola et al. |
| 2004/0209177 A1 | 10/2004 | Sreenivasan et al. |
| 2004/0211754 A1 | 10/2004 | Sreenivasan |
| 2004/0223131 A1 | 11/2004 | Choi et al. |
| 2004/0223883 A1 | 11/2004 | Choi et al. |
| 2004/0224261 A1 | 11/2004 | Resnick et al. |
| 2004/0241324 A1 | 12/2004 | Watts et al. |
| 2004/0251775 A1 | 12/2004 | Choi et al. |
| 2004/0256764 A1 | 12/2004 | Choi et al. |
| 2005/0006343 A1 | 1/2005 | Choi et al. |

FOREIGN PATENT DOCUMENTS

| | | |
|---|---|---|
| DE | 19648844 | 9/1997 |
| EP | 244884 | 3/1987 |
| EP | 733455 | 9/1996 |
| EP | 0867775 | 9/1998 |
| EP | 1460738 | 9/2004 |
| JP | 55-88332 | 12/1978 |
| JP | 57-7931 | 1/1982 |
| JP | 58-129074 | 8/1983 |
| JP | 63-138730 | 12/1986 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| WO | WO 87/02935 | 5/1987 |
| WO | WO 92/17883 | 10/1992 |
| WO | WO 98/10121 | 3/1998 |
| WO | WO 99/05724 | 2/1999 |
| WO | WO 99/45753 | 9/1999 |
| WO | WO 99/63535 | 12/1999 |
| WO | WO 00/21689 | 4/2000 |
| WO | WO 00/54107 | 9/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/63361 | 8/2001 |
| WO | WO 01/69317 | 9/2001 |
| WO | WO 01/79589 | 10/2001 |
| WO | WO 01/79591 | 10/2001 |
| WO | WO 01/79933 | 10/2001 |
| WO | WO 01/90816 | 11/2001 |
| WO | WO 02/06902 | 1/2002 |
| WO | WO 02/07199 | 1/2002 |
| WO | WO 02/08835 | 1/2002 |
| WO | WO 02/17383 | 2/2002 |
| WO | WO 02/22916 | 3/2002 |
| WO | WO 02/24977 | 3/2002 |
| WO | WO 02/067055 | 8/2002 |
| WO | WO 03/010289 | 2/2003 |
| WO | WO 03/079416 | 9/2003 |
| WO | WO 03/099536 | 12/2003 |
| WO | WO 2004/006120 | 1/2004 |
| WO | WO 2004/016406 | 2/2004 |
| WO | WO 2004/034424 | 4/2004 |
| WO | WO 2004/044651 | 5/2004 |
| WO | WO 2004/054784 | 7/2004 |
| WO | WO 2004/055594 | 7/2004 |
| WO | WO 2004/063815 | 7/2004 |
| WO | WO 2004/114016 | 12/2004 |

OTHER PUBLICATIONS

Abstract of Japanese Patent 55-88332.
Abstract of Japanese Patent 57-7931.
Abstract of Japanese Patent 02-92603.
Translation of Japanese Patent 02-92603.
Abstract of Japanese Patent 02-24848.
Translation of Japanese Patent 02-24848.
Heidari et al., "Nanoimprint Lithography at the 6 in. Wafer Scale," Journal of Vacuum Science Technology, Nov./Dec. 2000, pp. 3557-3560, vol. B, No. 18(6)/.
NERAC.COM Retro Search, "Reduction of Dimension of Contact Holes", Aug. 31, 2004.
NERAC.COM Retro Search, "Trim Etching of Features Formed on an Organic Layer", Sep. 2, 2004.
NERAC.COM Retro Search, "Multi-Layer Resists", Sep. 2, 2004.
Hu et al., "Flourescence Probe Technicques (FPT) for Measuring the Relative Efficiencies of Free-Radical Photoinitiators", s0024-9297(97)01390-9;"Macromoletules" 1998, vol. 31, No. 13, pp. 4107-4113, 1998 American Chemical Society. Published on Web May 29, 1998.
Feynman, Richard P., "There's Plenty of Room at the Bottom—An Invitation to Enter a New Field of Physics," 12 pp [online[Retreived Sep. 23, 2004 from URI:http://www.zyvex.com/nanotech/feynman.html.
CIBA Specialty Chemicals Business Line Coatings, "What is UV Curing?", 45 pp [online[Retreived Sep. 24, 2004 from URL:http//www.cibasc.com/image.asp?id=4040.
Communication Relating to the Results of the Partial International Search; International Appl. No. PCT/US2002/015551.
Papirer et al., "The Graftijng of Perfluorinated Silanes onto the Surface of Silica: Characterization by Inverse Gas Chromatography," Aug. 1993, pp. 238-242, vol. 159, Issue 1.
Abstract of Papirer et al., "The Graftijng of Perfluorinated Silanes onto the Surface of Silica: Characterization by Inverse Gas Chromatography," Aug. 1993, pp. 238-242, vol. 159, Issue 1.
Hirai et al., "Mold Surface Treatment for Imprint Lithography," Aug. 2001, pp. 457-462, vol. 14, No. 3.
Abstract of Hirai et al., "Mold Surface Treatment for Imprint Lithography," Aug. 2001, pp. 457-462, vol. 14, No. 3.
Sung et al., "Micro/nano-tribological Characteristics of Self-Assembled Monoloayer and its Application in Nano-Structure Fabrication," Jul. 2003, pp. 808-818, vol. 255, No. 7.
Abstract of Sung et al., "Micro/nano-tribological Characteristics of Self-Assembled Monoloayer and its Application in Nano-Structure Fabrication," Jul. 2003, pp. 808-818, vol. 255, No. 7.
Roos et al., "Nanoimprint Lithography with a Commerical 4 Inch Bond System for Hot Embossing," Oct. 2001, pp. 427-435, vol. 4343.
Abstract of Roos et al., "Nanoimprint Lithography with a Commerical 4 Inch Bond System for Hot Embossing," Oct. 2001, pp. 427-435, vol. 4343.
U.S. Appl. No. 09/698,317, filed Oct. 27, 2000, Choi et al.
U.S. Appl. No. 10/437,476, filed May 14, 2003, Meissl et al.
U.S. Appl. No. 10/614,716, filed Jul. 7, 2003, Sreenivasan et al.
U.S. Appl. No. 10/617,321, filed Jul. 10, 2003, Choi et al.
U.S. Appl. No. 10/666,527, filed Sep. 18, 2003, Bailey et al.
U.S. Appl. No. 10/677,639, filed Oct. 16, 2003, McMackin et al.
U.S. Appl. No. 10/687,519, filed Oct. 16, 2003, Nguyen et al.
U.S. Appl. No. 10/687,562, filed Oct. 16, 2003, Cherala et al.
U.S. Appl. No. 10/694,284, filed Oct. 27, 2003, Xu et al.
U.S. Appl. No. 10/757,778, filed Jan. 15, 2004, Watts et al.
U.S. Appl. No. 10/758,384, filed Jan. 15, 2004, Watts et al.
U.S. Appl. No. 10/760,821, filed Jan. 20, 2004, Sreenivasan et al.
U.S. Appl. No. 10/763,885, filed Jan. 23, 2004, Xu et al.
U.S. Appl. No. 10/784,911, filed Feb. 23, 2004, Xu et al.
U.S. Appl. No. 10/785,248, filed Feb. 24, 2004, Choi et al.
U.S. Appl. No. 10/788,700, filed Feb. 27, 2004, Sreenivasan et al.
U.S. Appl. No. 10/806,051, filed Mar. 22, 2004, Willson et al.
U.S. Appl. No. 10/858,100, filed Jun. 1, 2004, Choi et al.
U.S. Appl. No. 10/858,179, filed Jun. 1, 2004, Choi et al.
U.S. Appl. No. 10/864,214, filed Jun. 9, 2004, Sreenivasan et al.
U.S. Appl. No. 10/898,034, filed Jul. 23, 2004, McMackin et al.
U.S. Appl. No. 10/898,037, filed Jul. 23, 2004, McMackin et al.
Tomita et al., 6-axes Motion Control Method for Párallel-Linkage-Type Fine Motion Stage, JSPE-58-04, pp. 118-124, Nov. 11, 2002.
Uchida et al., A Mask-to-Wafer Alignment and Gap Setting Method for X-ray Lithography Using Gratings, J. Vac. Sci. Technol. B 9 (6), pp. 3202-3206, Nov. 1, 1991.
Stewart, D., A Platform With Six Degrees of Freedom, Proc Instn Mech Engrs, vol. 180 Pt 1 No. 15, pp. 371-378, May 28, 1965.
Hollis et al., A Six-Degree-of-Freedom Magnetically Levitated Variable Compliance Fine-Motion Wrist: Design, Modeling, and Control, IEEE Transactions on Robotics and Automation, vol. 7. No. 3, pp. 320-332, Jun. 1, 1991.
Claff, Jr., A Transistor's Guide to Organic Chemical Nomenclature, accurapid.com/jounral/02org.htm, Feb. 20, 2004.
Goldfarb et al., A Well-Behaved Revolute Flexure Joint for Compliant Mechanism Design, ASME Journal of Mechanical Design, vol. 121, No. 3, pp. 424-429, Sep. 1, 1999.
Abstract of Japanese Patent 58-129074, Aug. 1, 1983.
Chen et al., Adaptive Alignment of Photomasks for Overlay Placement, Journal of Vacuum Science. B 20(6), pp. 3099-3105, Nov. 1, 2002.
Eldada et al., Advanced Polymer Systems for Optoelectronic Integrated Circuit Applications, SPIE vol. 3006, pp. 344-361, Jan. 1, 1997.
Johnson et al., Advances in Step and Flash Imprint Lithography, SPIE Microlithography Conference, Feb. 23, 2003.
Eldada et al., Affordable WDM Components: The Polymer Solution, SPIE vol. 3234, pp. 161-174, Jan. 1, 1998.
Srinivasan et al., Alkyltrichlorosilane-Based Self-Assembled Monolayer Films for Stiction Reduction in Silicon Micromachines, Journal of Microelectromechanical Systems, vol. 7, No. 2, p. 252-260, Jun. 1, 1998.
Amendment from U.S. Appl. No. 10/775,707, Jan. 10, 2005.
Amendment from U.S. Appl. No. 10/806,956, Jan. 11, 2005.
Parikh et al., An Intrinsic Relationship between Molecular Structure in Self-Assembled n-Alkylsiloxane Monolayers and Deposition Temperature, Journal of Phys. Chem., pp. 7577-7590, Jul. 1, 1994.
Armitage et al., Analysis of Overlay Distortion Patterns, SPIE vol. 921 Integrated Circuit Metrology, Inspection, and Process Control II (1988), Jan. 1, 1988.
Mitsui et al., Application of Two-Wavelength Optical Heterodyne Alignment System in XS-1, Part of the SPIE Conference on Emerging Lithographic Technologies III, SPIE vol. 3676, pp. 455-464, Mar. 1, 1999.
Nguyen, Anh Quoc, Asymmetric Fluid-Structure Dynamics in Nanoscale Imprint Lithography, The University of Texas at Austin, pp. 1-111, Aug. 1, 2001.
Nakamatsu et al., Bilayer Resist Method for Room-Temperature Nanoimprint Lithography, Japanese Journal of Applied Physics, vol. 43, No. 6B, pp. 4050-4053, Jun. 29, 2004.
Arai et al., Calibration and Basic Motion of a Micro Hand Module, IEEE, pp. 1660-1665, Jan. 1, 1993.
Otto et al., Characterization and Application of a UV-based Imprint Technique, Microelectronic Engineering 57-58, pp. 361-366, Jan. 1, 2001.
Colburn et al., Characterization and Modeling of Volumetric and Mechanical Properties for Step and Flash Imprint Lithography Photopolymers, Journal of Vacuum Science Technology. vol. b. 19(6)., Nov. 1, 2001.
Goldfarb et al., Compliant Micromanipulator Design for Scaled Bilateral Telemanipulation of Small-Scale Environments, ASME International Mechanical Engineering Conference and Exposition, DSC-vol. 64, pp. 213-218, Nov. 1, 1998.
Peng et al., Compliant Motion Control of Kinematically Redundant Manipulators, IEEE Transactions on Robotics and Automation, vol. 9, No. 6, pp. 831-837, Dec. 1, 1993.
Koseki, Design and Accuracy Evaluation of High-Speed and High Precision Parallel Mechanism, Proc. of IEEE, Intl Conf. on Robotics & Automation, pp. 1340-1345, Jan. 1, 1998.
Rong et al., Design and Analysis of Flexure-Hinge Mechanism Used in Micro-Positioning Stages, ASME vol. 2, pp. 979-985, Jan. 1, 1994.
Hashimoto et al., Design and Characteristics of a Parallel Link Complaint Wrist, IEEE, Department of Mechanical Engineering, Kagoshiam University, pp. 2457-2462, May 1, 1994.

Choi et al., Design of Orientation Stages for Step and Flash Imprint Lithography, Precision Engineering, pp. 192-199, Jan. 1, 2001.

Pernette et al., Design of Parallel Robots in Microbotics, Robotica, vol. 15, pp. 417-420, Jan. 1, 1997.

Colburn et al., Development and Advantages of Step-and-Flash Lithography, Solid State Technology, Jul. 1, 2001.

Ohya et al., Development of 3-DOF Finger Module for Micro Manipulation, Proc. of IEEE, Intl. Conf. on Intelligent Robots and Systems, pp. 894-899, Mar. 1, 1999.

Arai et al., Development of a New Parallel Manipulator with Fixed Linear Actuator, In Proceedings of Japan/USA Symposium on Flexible Automation, vol. 1, ASME, New York, pp. 145-149, Jan. 1, 1996.

Malik et al., Development of an Energetic Ion Assisted Mixing and Deposition Process for TiNx and Diamondlike Carbon Films, Using a Co-Axial Geometry in Plasma Source Ion Implantation, Journal of Vacuum Science and Technology A-Vacuum Surface and Films 15 (6); pp. 2875-2879., Nov. 1, 1997.

Tanikawa et al., Development of Small-sized 3 DOF Finger Module in Micro Hand for Micro Manipulation, Proc. of IEE, Intl Conf. on Intelligent Robots and Systems, pp. 876-881, Mar. 1, 1999.

Sowah, Diamond used to Break the Mould, Retrieved Sep. 2, 2003 from URL: http://www.electronictimes.com/story/OEG20020918S0003, Sep. 18, 2002.

Gokan et al., Dry Etch Resistance of Organic Materials, J. Electrochem. Soc.: Solid-State Science and Technology, pp. 143-146, Jan. 1, 1983.

Rong et al., Dynamics of Parallel Mechanism with Direct Compliance Control, IEEE, pp. 1753-1758, Jan. 1, 1997.

Compon et al., Electroanalysis at Diamond-Like and Doped-Diamond Electrodes, Electroanalysis 15(17); pp. 1349-1363, Sep. 1, 2003.

Mirkin et al., Emerging Methods for Micro- and Nanofabrication, MRS Bulletin, pp. 506-509, Jul. 1, 2001.

Krauss et al., Fabrication of Nanodevices Using Sub-25 nm Imprint Lithography, Appl. Phys. Lett. 67(21), pp. 3114-3116, Jan. 1, 1995.

Bender et al., Fabrication of Nanostructures using a UV-based Imprint Technique, Microelectronic Engineering 53, pp. 233-236, Jan. 1, 2000.

Kumar et al., Features of Gold Having Micrometer to Centimeter Dimensions can be Formed Through a Combination of Stamping with an Elastomeric Stamp and an Alkanethiol "ink" followed by Chemical Etching, Applied Physics Letters, vol. 63, Issue 14, pp. 2002-2004, Oct. 4, 1993.

Krug et al., Fine Patterning of Thin Sol-gel Films, Journal of Non-Crystalline Solids 147 & 148, pp. 447-450, Jan. 1, 1992.

Blomquist et al., Fluorinated Acrylates in making Low-Loss, Low-Birefringence, and Single-Mode Optical Waveguides with Exceptional Thermo-Optic Properties, SPIE Conference on Linear Optical Properties of Waveguides and Fibers, vol. 3799, pp. 266-279, Jul. 1, 1999.

Lucas Aerospace, Free-Flex® Pivot Catalog, Jan. 1, 1999.

Hexapods, G1000-PS Power Series, www.hexapods.com.

Stix, Gary, Getting More from Moore's, Scientific American, Apr. 1, 2001.

Hakovirta et al., Heat Resistance of Fluorinated Diamond-Like Carbon Films, Diamond and Related Materiasl 10(8); pp. 1486-1490, Aug. 1, 2001.

Physik Instrumente, Hexapod Six-Axis Parallel Kinematics Robot, Nano Positioning, pp. 8.4-8.5, Jan. 1, 1998.

Resnick et al., High Resolution Templates for Step and Flash Imprint Lithography, Journal of Microlithography, Microfabrication, and Microsystems. vol. 1. No. 3., Oct. 1, 2002.

Kim et al., High-precision Magnetic Levitation Stage for Photolithography, Precision Engineering. vol. 22. No. 2, pp. 66-77, Apr. 1, 1998.

Paros et al., How to design Flexure Hinges, Machine Design, pp. 151-156, Nov. 25, 1965.

Raibert et al., Hybrid Position/Force Control of Manipulators, Journal of Dynamic Systems, Measurement, and Control, vol. 102, pp. 126-133, Jun. 1, 1981.

Kim et al., Hydrophobic Properties of Ethylene-Vinyl Alcohol Copolymer Treated with Plasma Source Ion Implantation, Journal of Applied Polymer Science 92 (4); pp. 2069-2075, May 14, 2004.

Sreenivasan et al., IDF Spin Cast Imprinting, Powerpoint Presentation, Oct. 21, 2004.

Hogan, Neville, Impedance Control: An Approach to Manipulation: Part I—Theory, Journal of Dynamic Systems, Measurement, and Control, vol. 107, pp. 1-7, Mar. 1, 1985.

NERAC.COM Retro Search, Imprint Lithography, , Oct. 16, 2004.

Chou et al., Imprint Lithography with 25-Nanometer Resolution, Science vol. 272, pp. 85-87, Apr. 5, 1996.

Chou et al., Imprint Lithography with Sub-10 nm Feature Size and High Throughput, Microelectronic Engineering 35, pp. 237-240, Jan. 1, 1997.

Chou et al., Imprint of Sub-25 nm Vias and Trenches in Polymers, Appl. Phys. Lett. 67 (21), Nov. 20, 1995.

Kawata et al., Imprint/Photo Hybrid Litography Using Conventional Contact Aligner, Japanese Journal of Applied Physics, vol. 43, No. 6B, pp. 4027-4030, Jun. 29, 2004.

Moon et al., Interferometric-Spatial-Phase Imaging for Six-Axis Mask Control, MIT NanoStructures Laboratory, Research Laboraty of Electronics, Oct. 17, 2003.

International Search Report for PCT/US00/05751, Jul. 25, 2000.
International Search Report for PCT/US00/30041, Oct. 18, 2001.
International Search Report for PCT/US01/21005, Sep. 5, 2001.
International Search Report for PCT/US01/26049, Feb. 19, 2002.
International Search Report for PCT/US02/23610, May 29, 2003.
International Search Report for PCT/US03/08293, Jul. 2, 2003.
International Search Report for PCT/US03/18020, Sep. 2, 2003.
International Search Report for PCT/US03/23948, Jan. 14, 2005.
International Search Report for PCT/US97/13348, Nov. 19, 1997.
International Search Report for PCT/US99/23717, Feb. 4, 2000.

Wu, Large Area High Density Quantized Magnetic Disks Fabricated Using Nanoimprint Lithography, J. Vac. Sci. Technol. B 16(6), pp. 3825-3829, Nov. 1, 1998.

Mansky et al., Large-Area Domain Alignment in Block Copolymer Thin Films Using Electric Fields, Macromolecules. vol. 31. No. 13, pp. 4399-4401, Jun. 9, 1998.

Trilogy Systems, Linear Motors 310 Specificaiton, www.trilogysystems.com, Jan. 1, 2001.

Chou et al., Lithographically Induced Self-assembly of Periodic Polymer Micropillar Arrays, J. Vac. Sci. Technol. B 17 (6), pp. 3197-3202, Nov. 1, 1999.

Wilson et al., Lithography and Etch Issues, Handbook of Multilevel Metallization for Integrated Circuits, pp. 566-567, Jan. 1, 1993.

Howell et al., Loop-Closure Theory for the Analysis and Synthesis of Compliant Mechanisms, Journal of Mechanical Design, vol. 118, pp. 121-125, Mar. 1, 1996.

Haisma et al., Mold-assisted Nanolithography: A Process for Reliable Pattern Replication, J. Vac. Sci. Technol. B, pp. 4124-4128, Nov. 1, 1996.

Lin, Multi-Layer Resist Systems, Introduction to Microlithography, pp. 287-349, Feb. 14, 1983.

Bender et al., Multiple Imprinting in UV-based Nanoimprint Lithography: Related Material Issues, Microelectronic Engineering 61-62, pp. 407-413, Jan. 1, 2002.

Chou et al., Nanoimprint Lithography, Journal of Vacuum Science Technolgoy B 14(16), pp. 4129-4133, Nov. 1, 1996.

Chou, Stephen Y., Nanoimprint Lithography and Lithographically Induced Self-Assembly, MRS Bulletin, pp. 512-517, Jul. 1, 2001.

White, et al., Novel Alignment System for Imprint Lithography, J. Vac. Sci. Technol. B 18(6), pp. 3552-3556, Nov. 1, 2000.

Office action from Chinese Patent Application No. 01815367.4, Oct. 15, 2004.

Office Action from U.S. Appl. No. 10/053,357, Dec. 16, 2003.
Office Action from U.S. Appl. No. 09/905,718, Dec. 22, 2004.
Office Action from U.S. Appl. No. 10/293,919, Jan. 28, 2005.

Hakovirta et al., Optical Properties of Fluorinated Diamond-Like Carbon Films Produced by Pulsed Glow Discharge Plasma Immersion Ion Processing, Journal of Applied Physics 88(3); pp. 1456-1459, Aug. 1, 2000.

Sagiv, Jacob, Organized Monolayers by Absorption. 1. Formation and Structure of Oleophobic Mixed Monolayers on Solid Surfaces, Journal of the American Chemical Society/102:1, Jan. 2, 1980.

Merlet, J-P., Parallel Manipulators: State of the Art and Perspectives, Advanced Robotics, vol. 8, pp. 589-596, Jan. 1, 1994.

Wang et al., Passive Compliance versus Active Compliance in Robot-Based Automated Assembly Systems, Industrial Robot vol. 25, No. 1, pp. 48-57, Jan. 1, 1998.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17, Jan. 1, 2000.

Photoresist Coating Methods, e-mail from Susan Bagen(BAGEN@aol.com) to Dhaval Shah, Sep. 18, 1997.

Physick Instruments, PI Online-Catalog, PI Online Catalog, www.physikinstruments.com, Jan. 1, 1999.

Plasmatherm SLR-720-740 Dual Chamber RIE System for Sale, www.classoneequipment.com/cfequipdetails.asp?ID=111& FID=12, Feb. 7, 2005.

Cowie, J. M. G., Polymers: Chemistry and Physics of Modem Materials, 2nd Ed., Jan. 1, 1991.

Braeuer et al., Precise Polymer Micro-Optical Systems, MRS Bulletin, pp. 519-522, Jul. 1, 2001.

Slocum, Alexander H., Precision Machine Design: Macromachine Design Philosophy and its Applicability to the Design of Micromachines, Micro Electro Mechanical Systems, Feb. 4, 1992.

Mittal, Precision Motion Control of a Magnetic Suspension Actuator Using a Robust Nonlinear Compensation Scheme, IEE/ASME Transactions on Mechatronics. vol. 2. No. 4, pp. 268-280, Dec. 1, 1997.

Martin et al., Predication of Fabrication Distortions in Step and Flash Imprint Lithography Templates, Journal of Vacuum Science. B 20(6) pp. 2891-2895, Nov. 1, 2002.

Scheer et al., Problems of the Nanoimprinting Technique for Nanometer Scale Pattern Definition, J. Vac. Sci. Technol. B, pp. 3917-3921, Nov. 1, 1998.

Butter et al., Production and Wetting Properties of Fluorinated Diamond-Like Carbon Coatings, Thin Solid Films, 311(1-2); pp. 107-113, Dec. 31, 1997.

Yu et al., Properties of Fluorinated Amorphous Diamond Like Carbon Films by PECVD, Applied Surface Science 219 (3-4); pp. 228-237, Dec. 1, 2003.

Mansano et al., Protective Carbon Layer for Chemical Corrosion of Stainless Steel, Diamond and Related Materials 12 (3-7); pp. 749-752, Mar. 1, 2003.

Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026, Jun. 29, 2004.

Otto et al., Reproducibility and Homogeneity in Step and Repeat UV-Nanoimprint Lithography, Microelectronic Engineering 73-74, pp. 152-156, Jan. 1, 2004.

Kanetomo et al., Robot for Use in Ultrahigh Vacuum, Solid State Technology, pp. 63-72, Aug. 1, 1997.

Eldada et al., Robust Photopolymers for MCM, Board, and Backplane Optical Interconnects, SPIE vol. 3288, pp. 175-191, Jan. 1, 1998.

Kotachi et al., Si-Containing Positive Resist for ArF Excimer Laser Lithography, Photopolymer Science and Technology, pp. 615-622, Nov. 4, 1995.

Williams et al., Six Degree of Freedom Mag-Lev Stage Development, SPIE vol. 3051, 856-867, Jan. 1, 1997.

Xia et al., Soft Lithography, Angew. Chem. Int. Ed., pp. 550-575, Jan. 1, 1998.

Xia et al., Soft Lithography, Annu Rev. Mater Sci. 1998 28: 153-184, Jan. 1, 1998.

Sol-Gel Chemistry, www.prsc/usm.edu/mauritz/solgel.html, Feb. 2, 2004.

Sol-Gel Glass, optoweb.fis.uniroma2.it/opto/solgel, Jan. 30, 2004.

Sol-Gel Technology, www.chemat.com/html/solgel.html, Jan. 14, 2004.

Luurtsema, Gregory A., Spin Coating for Rectangular Substrates, Retrieved May 23, 2002 from URL: http://buffy.eecs.berkelye.edu/IRO/Summary/97abstracts/gluurts.2.html, May 23, 2002.

Colburn et al., Step and Flash Imprint Lithography for sub-100 nm Patterning, Proceedings of SPIE vol. 3997, pp. 453-457, Jan. 1, 2000.

Colburn et al., Step and Flash Imprint Lithography: A New Approach to High-Resolution Patterning, Proc. of SPIE, vol. 3676, Mar. 1, 1999.

Otto et al., Step and Repeat UV-Nanoimprint Lithography: Material Issues, NNTO2 San Francisco, Dec. 11, 2002.

Hiroshima et al., Step-and-Repeat Photo-Nanoimprint System Using Active Orientation Head, Japanese Journal of Applied Physics, vol. 43, No. 6B, pp. 4012-4016, Jun. 29, 2004.

Ananthasuresh et al., Strategies for Systematic Synthesis of Compliant Mems, DSC-vol. 55-2, Dynamic Systems and Control: vol. 2, pp. 677-686, Nov. 1, 1994.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178, Apr. 17, 2004.

Shibuichi et al., Super Water- and Oil-Repellent Surfaces Resulting from Fractal Structure, Journal of Colloid and Interface Science, vol. 208, No. 1, pp. 287-294, Dec. 1, 1998.

Kim et al., Surface Energy and Polarity of Treated Indium-Tin-Oxide Anodes for Polymer Light-Emitting Diodes Studied by Contact-Angle Measurements, Journal of Applied Physics, vol. 86, No. 5, pp. 2774-2778, Aug. 4, 2004.

Zhu et al., The Improvement of the Oxidation Resistance of TiAl Alloys by Fluorine Plasma-Based Ion Implantation, Surface and Coatings Technology 158; pp. 502-507, Sep. 1, 2002.

Schneider et al., The Wave-Printer: Towards Large-Area, Multilayer Microcontact-Printing, Proc. of 4th euspen International Conference, Glasgos, Scotland (UK), May 1, 2004.

Tajbakhsh et al., Three-Degree-of-Freedom Optic Mount for Extreme Ultraviolet Lithography, American Society for Precision Engineering, pp. 359-362, Jan. 1, 1998.

Hexel Corporation, Tornado 2000 System Specifications, www.hexel.com, Oct. 12, 1999.

Lee et al., Ultra Precision Positioning System for Servo Motor-piezo Actuator Using the Dual Servo Loop and Digital Filter Implementation, American Society for Precision Engineering, pp. 287-290, Jan. 1, 1998.

Chou et al., Ultrafast and Direct Imprint of Nanostructures in Silicon, Nature, Col. 417, (Jun. 2002), pp. 835-837, Jun. 1, 2002.

Lee et al., Ultraprecision Stage for Alignment of Wafers in Advanced Microlithography, Precision Engineering, pp. 113-122, Sep. 1, 1997.

Vanderbilt Univ. Office of Transfer Tech, VU 9730 Specifications for Improved Flexure Device, www.vanderbilt.edu, Jan. 1, 2003.

Feldman, Wafer Chuck for Magnification Correction in X-ray Lithography, J. Vac. Sci. Technol. B 16(6), pp. 3476-3479, Nov. 1, 1998.

* cited by examiner

METHOD TO ARRANGE FEATURES ON A SUBSTRATE TO REPLICATE FEATURES HAVING MINIMAL DIMENSIONAL VARIABILITY

The field of invention relates generally to patterning substrates. More particularly, the present invention is directed to arranging features on a substrate to minimize dimensional variability among the features.

Control features dimensions formed during semiconductor processes is highly desired. In this manner, features may be fabricated having tightly controlled dimensional variations, i.e., variability from the desired dimensions is minimized. Features formed with tightly controlled dimensional variations are used for many purposes, including metrology standards.

Metrology standards are employed in many industries to measure the operation of varying equipment and processes. For semiconductor processes, a typical metrology standard may include grating structures, L-shaped structures and other common patterning geometries found on production devices. In this manner, the metrology standards facilitate measurement of the performance of the processing equipment.

Conventional metrology standards are manufactured from a variety of conventional processes, such as e-beam lithography, optical lithography, and using various materials. Exemplary materials include insulative, conductive or semiconductive materials. After formation of the metrology standards using conventional processes, a post process characterization technique is employed to measure the accuracy of the metrology features. This is due, in part, to the difficulty in repeatably producing reliable accurate metrology standards. A drawback with the conventional processes for manufacturing metrology standards is that the post process characterization step is time consuming. In addition, the difficulty in repeatably producing reliable metrology standards results in a low yield rate. A processing technique that may prove beneficial in overcoming the drawbacks of the conventional processes for fabricating metrology standards is known as imprint lithography.

An exemplary imprint lithography process is disclosed in U.S. Pat. No. 6,334,960 to Willson et al. Willson et al. disclose a method of forming a relief image in a structure. The method includes providing a substrate having a planarization layer. The planarization layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the planarization layer that contains a relief structure complimentary to that of the mold. The mold is then separated from the solid polymeric material such that a replica of the relief structure in the mold is formed in the solidified polymeric material. The planarization layer and the solidified polymeric material are subjected to an environment to selectively etch the planarization layer relative to the solidified polymeric material such that a relief image is formed in the planarization layer. Advantages with this imprint lithography process are that it affords fabrication of structures with minimum feature dimensions that are far smaller than is provided employing standard semiconductor process techniques.

It is desired, therefore, to provide a method for reliably producing precision features on a substrate for use as metrology standards.

SUMMARY OF THE INVENTION

The present invention is directed to a method of and a mold for arranging features on a substrate to replicate the features while minimizing dimensional variability in the features. The method includes arranging features on a layer to minimize thickness variations in the layer that are attributable to density variations of the plurality of features on the layer. The features are transferred into an underlying substrate. Recognizing thickness variations in the patterned layer makes difficult controlling feature dimensions formed therein, it is believed that by forming the features so as to define a uniform fill factor in the layer, the thickness variations may be reduced, if not abrogated. To that end, one method in accordance with the present invention includes forming a flowable material on the substrate. Thereafter, a plurality of features is formed in a region of the flowable material. The plurality of features are arranged to provide a substantially uniform fill factor in the region. These and other embodiments are described more fully below.

DETAILED DESCRIPTION OF THE PREFERRED EMBODIMENTS

Figure 1:
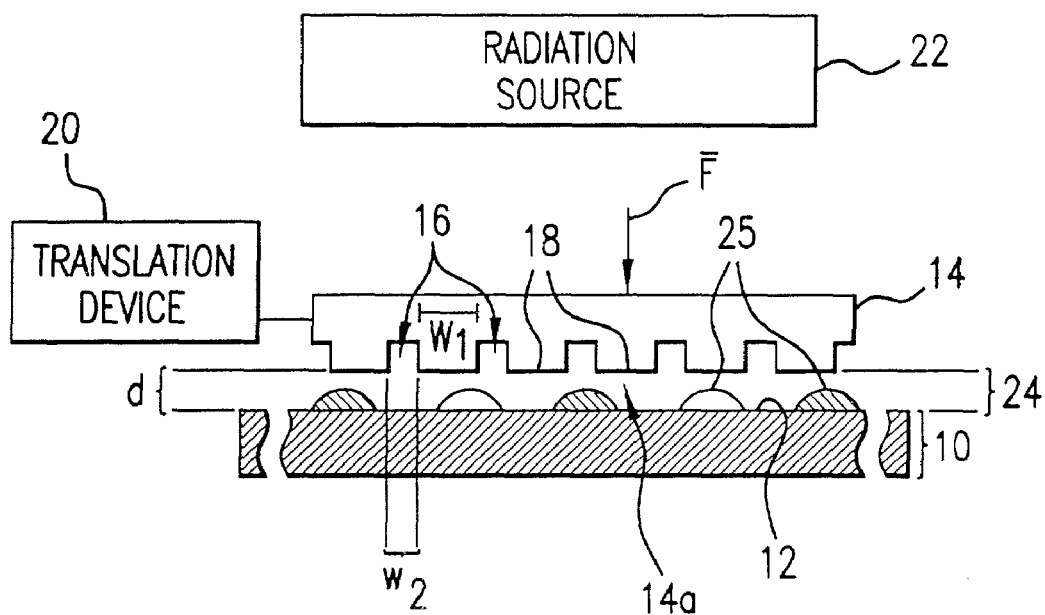
FIG. 1 is a simplified elevation view of a lithographic system in accordance with the present invention.

Referring to FIG. 1, a lithographic system in accordance with an embodiment of the present invention includes a substrate 10, having a substantially planar region shown as surface 12. Disposed opposite substrate 10 is an imprint device, such as a mold 14, having a plurality of features thereon, forming a plurality of spaced-apart recessions 16 and protrusions 18. In the present embodiment, recessions 16 are a plurality of grooves extending along a direction parallel to protrusions 18 that provide a cross-section of mold 14 with a shape of a battlement. However, recessions 16 may correspond to virtually any feature required to create an integrated circuit. A translation device 20 is connected between mold 14 and substrate 10 to vary a distance "d" between mold 14 and substrate 10. A radiation source 22 is located so that mold 14 is positioned between radiation source 22 and substrate 10. Radiation source 22 is configured to impinge radiation on substrate 10. To realize this, mold 14 is fabricated from material that allows it to be substantially transparent to the radiation produced by radiation source 22.

Figure 2:
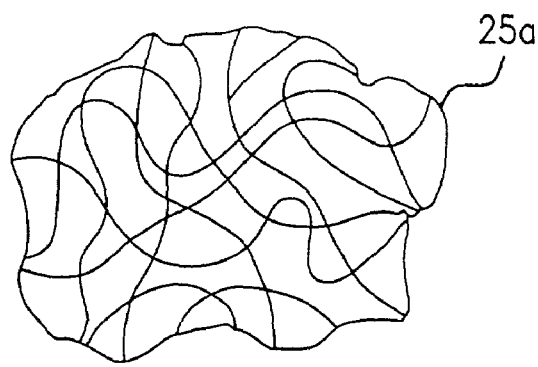
FIG. 2 is a simplified representation of material from which an imprinting layer, shown in FIG. 1, is comprised before being polymerized and cross-linked.

Referring to both FIGS. 1 and 2, a flowable region, such as an imprinting layer 24, is disposed formed on surface 12. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in Ultrafast and Direct Imprint of Nanostructures in Silicon, Nature, Col. 417, pp. 835-837, June 2002. In the present embodiment, however, flowable region is formed using imprint lithography. Specifically, flowable region consists of imprinting layer 24 deposited as a plurality of spaced-apart discrete beads 25 of material 25a on substrate 10, discussed more fully below. Imprinting layer 24 is formed from a material 25a that may be selectively polymerized and cross-linked to record a desired pattern. Material 25a is shown in FIG. 3 as being cross-linked at points 25b, forming cross-linked polymer material 25c.

Figure 4:
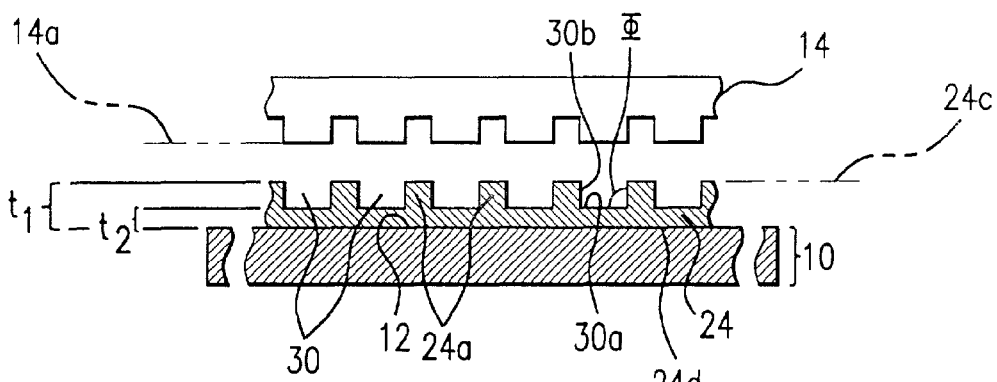
FIG. 4 is a simplified elevation view of the mold spaced-apart from the imprinting layer, shown in FIG. 1, after patterning of the imprinting layer.

Referring to FIGS. 1, 2 and 4, the pattern recorded by imprinting layer 24 is produced, in part, by mechanical contact with mold 14. To that end, translation device 20 reduces the distance "d" to allow imprinting layer 24 to come into mechanical contact with mold 14, spreading beads 25 so as to form imprinting layer 24 with a contiguous formation of material 25a over surface 12. In one embodiment, distance "d" is reduced to allow sub-portions 24a of imprinting layer 24 to ingress into and fill recessions 16.

To facilitate filling of recessions 16, material 25a is provided with the requisite properties to completely fill recessions while covering surface 12 with a contiguous formation of material 25a. In the present embodiment, sub-portions 24a of imprinting layer 24 in superimposition with protrusions 18 remain after the desired, usually minimum distance "d", has been reached, leaving sub-portions 24a with a thickness $t_1$, and sub-portions 24b with a thickness, $t_2$. Thicknesses "$t_1$" and "$t_2$" may be any thickness desired, dependent upon the application. Typically, $t_1$ is selected so as to be no greater than twice width u of sub-portions 24a, i.e., $t_1 \leq 2u$.

Figure 3:
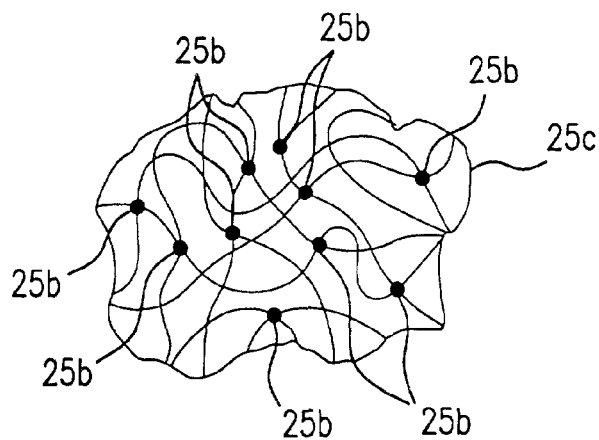
FIG. 3 is a simplified representation of cross-linked polymer material into which the material shown in FIG. 2 is transformed after being subjected to radiation.

Referring to FIGS. 1, 2 and 3, after a desired distance "d" has been reached, radiation source 22 produces actinic radiation that polymerizes and cross-links material 25a, forming cross-linked polymer material 25c. As a result, the composition of imprinting layer 24 transforms from material 25a to material 25c, which is a solid. Specifically, material 25c is solidified to provide side 24c of imprinting layer 24 with a shape conforming to a shape of a surface 14a of mold 14, shown more clearly in FIG. 4.

Referring to FIGS. 1, 2 and 3 an exemplary radiation source 22 may produce ultraviolet radiation. Other radiation sources may be employed, such as thermal, electromagnetic and the like. The selection of radiation employed to initiate the polymerization of the material in imprinting layer 24 is known to one skilled in the art and typically depends on the specific application which is desired. After imprinting layer 24 is transformed to consist of material 25c, translation device 20 increases the distance "d" so that mold 14 and imprinting layer 24 are spaced-apart.

Referring to FIG. 4, additional processing may be employed to complete the patterning of substrate 10. For example, substrate 10 and imprinting layer 24 may be etched to increase the aspect ratio of recesses 30 in imprinting layer 24. To facilitate etching, the material from which imprinting layer 24 is formed may be varied to define a relative etch rate with respect to substrate 10, as desired. The relative etch rate of imprinting layer 24 to substrate 10 may be in a range of about 1.5:1 to about 100:1. Alternatively, or in addition to, imprinting layer 24 may be provided with an etch differential with respect to photo-resist material (not shown) selectively disposed on side 24c. The photo-resist material (not shown) may be provided to further pattern imprinting layer 24, using known techniques. Any etch process may be employed, dependent upon the etch rate desired and the underlying constituents that form substrate 10 and imprinting layer 24. Exemplary etch processes may include plasma etching, reactive ion etching, chemical wet etching and the like.

Figure 5:
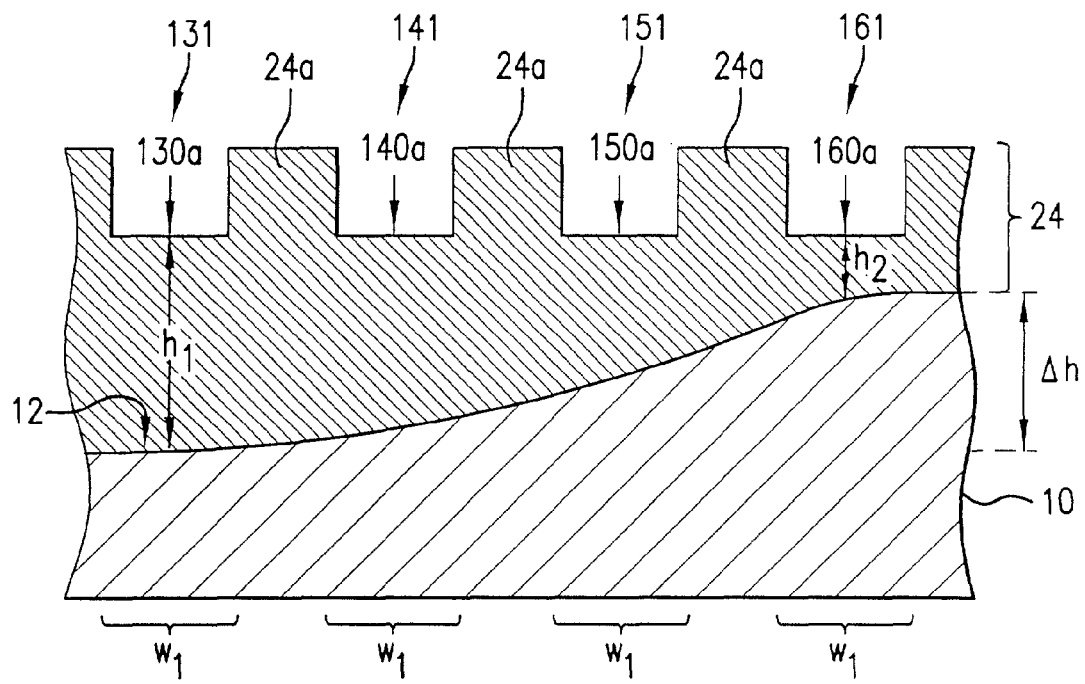
FIG. 5 is a detailed view of the imprinting layer shown in FIG. 4 demonstrating the non-planarity of substrate.

Referring to FIG. 5, a problem addressed by the present invention concerns formation of features on substrates having extreme topologies when compared to the dimensions of features formed thereon. As a result, substrate 10 appears to present a non-planar surface 12. This has been traditionally found in substrates formed from gallium arsenide (GAs) or indium phosphide (InP). However, as the feature dimensions decrease substrates that have historically been considered planar may present a non-planar surface to features formed thereon. For example, substrate 10 is shown with variations in surface height. The variation in height frustrates attempts to control the dimensions of features formed into substrate 10, because of the resulting differences in distances between nadirs 130a and 160a from surface 12, shown as $_1$ and $h_2$, respectively. The height differential, $\Delta h$, between surface nadir 130a and nadir 160a is defined as follows:

$$\Delta h = |h_1 - h_2| \tag{1}$$

Height differential, $\Delta h$, results in differing etch characteristics of vias formed into substrate 10, discussed more fully below with respect to FIGS. 6 and 7.

Figure 6:
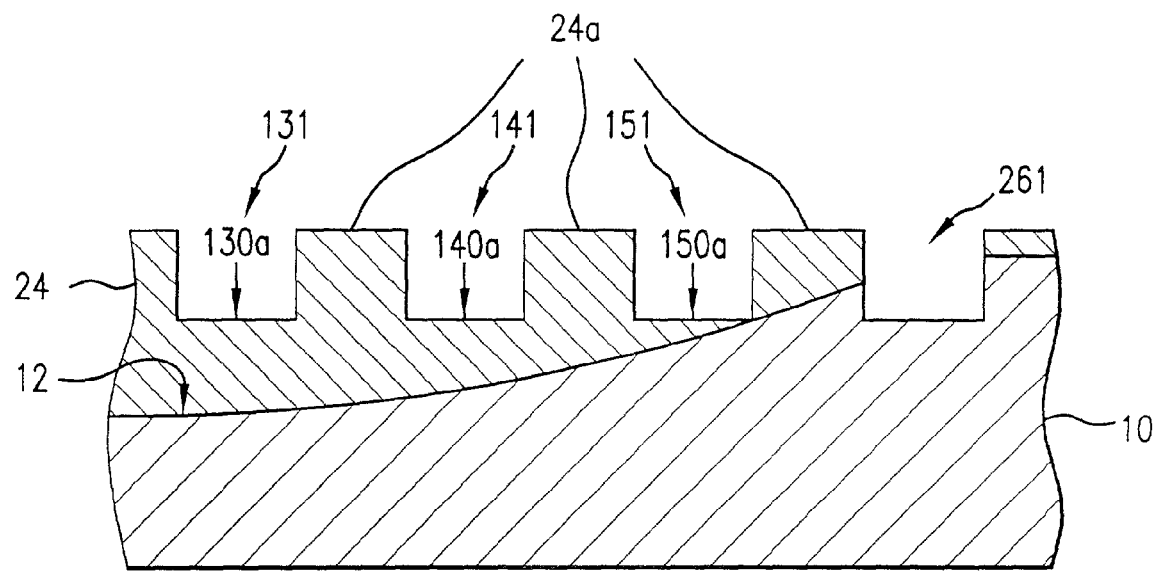
FIG. 6 is a detailed view of the imprinting layer shown in FIG. 5 showing the transfer of the features in the imprinting layer into the substrate during an etching process.
Figure 7:
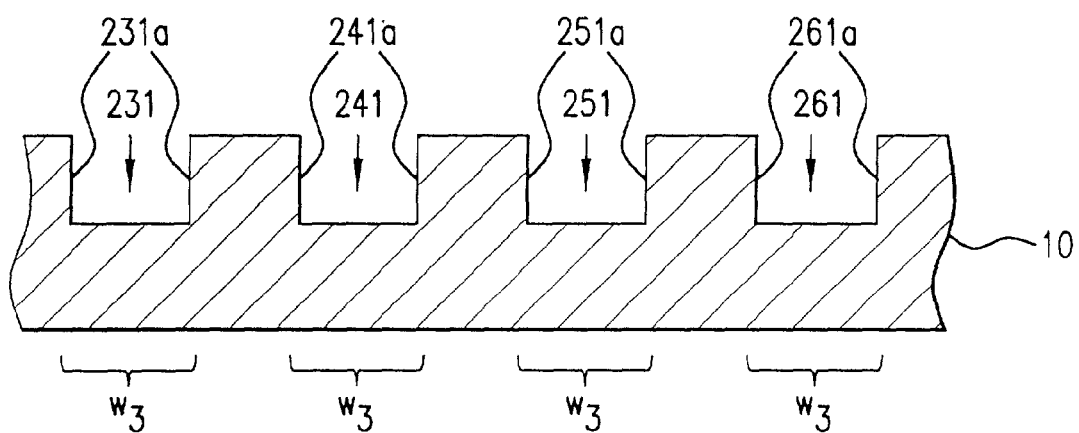
FIG. 7 is a detailed view of the substrate shown in FIG. 6 after completion of the etch process that transfers features of the imprinting layer into the substrate.

Referring to FIGS. 5, 6 and 7, transfer of the features, such as recesses 131, 141, 151, 161 and sub-portions 24a, in imprinting layer 24 into substrate 10 occurs through etch processes. The height differential, $\Delta h$, results during formation of via 261 in substrate 10 before formation of the remaining vias, which will be formed in regions of substrate 10 in superimposition with recesses 131, 141 and 151. This results from the time during which substrate 10 is etched during formation of vias. Specifically, nadir 160a reaches surface 12 of substrate 10 before the remaining nadirs 130a, 140a and 150a. As a result an etch differential occurs, i.e., the etch process to which substrate 10 is exposed to form vias therein differs over substrate surface 12. The etch differential is problematic, because it results in anisotropic etching that distorts the features transferred into substrate 10 from imprinting layer 24. The distortion presents, inter alia, by variations in width $w_3$ between vias 231, 241, 251 and 261 formed into substrate 10.

Ideally, the width of recesses 131, 141, 151 and 161, $w_1$, should be substantially similar to width $w_3$. However the height differential, $\Delta h$, results in $w_3$ of vias 251 and 261 being greater than $w_1$, as well as larger than $w_3$ of vias 231 and 241. The difference between the widths $w_3$ of vias 231, 241, 251 and 261 defines a differential width $\Delta w$. The greater the height differential, $\Delta h$, the greater the differential width $\Delta w$. As a result $\Delta w$ of via 231 and 261 is greater than $\Delta w$ of vias 231 and 251.

Referring to both FIGS. 4, 6, 7 and 8, to avoid these drawbacks, the present invention seeks to minimize the height differential $\Delta h$ by minimizing layer thickness $t_2$ and selecting a region of substrate 10 upon which to locate and define area, A, so as to maximize the planarity of area A. Optimized production yield favors maximization of area A. However, it was determined that the smaller area, A, is made, the greater the planarity of substrate surface 12 in area, A. In short, minimization of area, A, maximizes the planarity of the same. Thus, attempts to obtain large production yields, appears to be in conflict with maximizing the planarity of area, A, because maximizing the area A reduces the planarity of surface 12 associated with area, A.

The manufacture of metrology standards, however, does not require large yields. Therefore, in the present embodiment of the invention, the location and size of area, A, is chosen to maximize the planarity of surface 12 in area, A of surface 12 over which vias 231, 241, 251 and 261 are formed. It is believed that by appropriately selecting area, A, over which vias 231, 241, 251 and 261 are formed, it will be possible to deposit an imprinting layer 24 of sufficiently small thickness $t_2$ while minimizing height differential $\Delta h$, if not abrogating the height differential $\Delta h$ entirely. This provides greater control over the dimensions of recesses 131, 141, 151 and 161, that may be subsequently formed into imprinting layer 24, thereby affording the fabrication of features on the order of a few nanometers.

Figure 8:
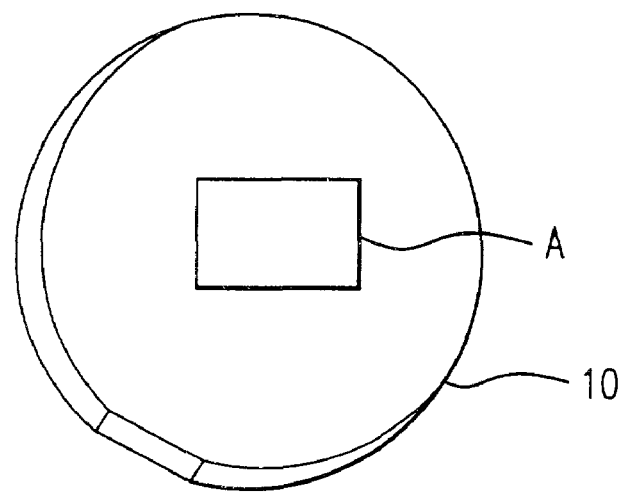
FIG. 8 is a perspective view of the substrate shown in FIGS. 1-7.
Figure 9:
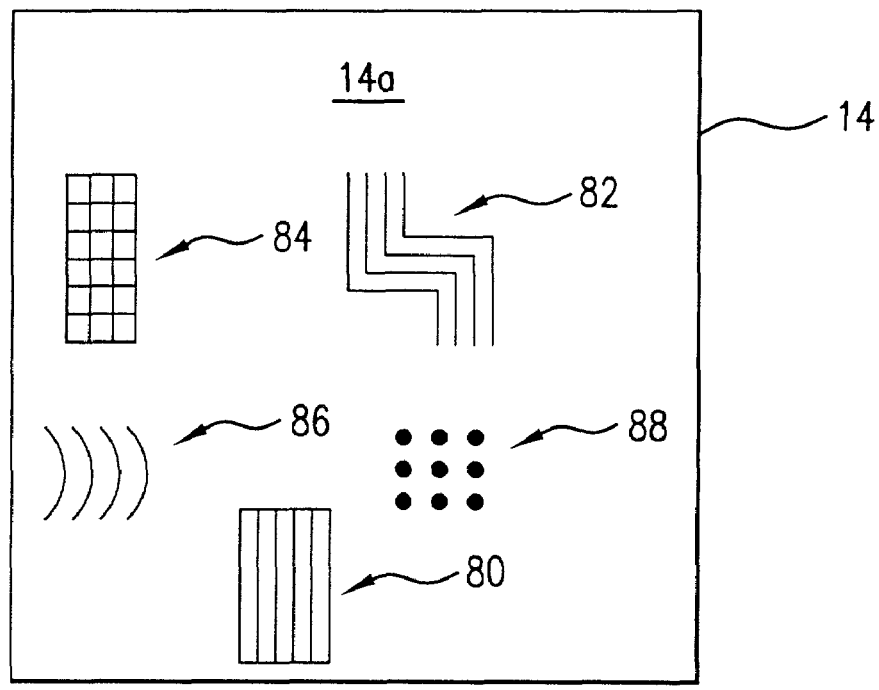
FIG. 9 is a detailed view of a mold shown in FIG. 1, in accordance with one embodiment of the present invention.

Referring to FIGS. 1, 4 and 8, to that end, the minimum layer thickness was chosen to avoid visco-elastic behavior of the liquid in beads 25. It is believed that visco-elastic behavior makes difficult controlling the imprinting process. For example, the visco-elastic behavior defines a minimum thickness that layer 24 may reach, after which fluid properties, such as flow, cease. This may present by bulges in nadirs 130a, 140a, 150a and 160a as well as other problematic characteristics. In the present embodiment it was determined that providing imprinting layer 24 with a minimum thickness $t_2$ of no less than approximately 10 nanometers satisfied this criteria, i.e., it was the minimum thickness that could be achieved while preventing imprinting layer 24 from demonstrating visco-elastic behavior. Assuming a uniform thickness, $t_2$, over layer 24, e.g., sub-portions 24a and recesses 131, 141, 151 and 161 not being present so that side 24c is planar it was determined that the volume of liquid in beads 25 may define the planarity of side 24d that forms an interface with surface 12 and is disposed opposite to side 24c. The volume is typically selected to maximize the planarity of side 24d, which forms an interface with surface 12. With a priori knowledge of the topology of surface 12, the size and locus of area, A, may be chosen to maximize planarity over area A. Knowing A and the desired layer thickness $t_2$, the volume, V, may be derived from the following relationship:

$$V = A t_2 \quad (2)$$

However, with the presence of features, such as sub-portions 24a and recesses 131, 141, 151 and 161, results in layer 24 having a varying thickness over area, A. Thus, equation (2) is modified to take into consideration volumetric changes required due to the varying thickness of layer 24 over area, A. Specifically, the volume, V, is chosen so as to minimize thickness $t_2$, while avoiding visco-elastic behavior and providing the requisite quantity of liquid to include features, such as sub-portions 24a of thickness $t_1$, and recess 131, 141, 151 and 161 into layer 24. As a result, in accordance with this embodiment of the invention, the volume, V, of liquid in beads 25 may be defined as follows:

$$V = A(t_2 + f t_1) \quad (3)$$

where f is the fill factor and A, $t_2$ and $t_1$ are as defined above.

Referring to FIGS. 1, 4, 7, 8 and 9, further control of the dimensions of features formed into substrate 10 may be achieved by proper placement and selection of recessions 16 and protrusions 18 over surface 14a. Specifically, the arrangement of recessions 16 and protrusions 18 on mold 14 may be designed to define a uniform fill factor over mold surface 14a. As a result, the size of etch areas will be substantially equal to the size of non-etch areas of substrate 10 in area A, where features on mold surface 14a are imprinted. This arrangement of features reduces, if not avoids, variations in imprinting layer 24 thickness by minimizing pattern density variations. By avoiding thickness variations in imprinting layer 24, distortions caused by the transfer of features into substrate 10 during etch processes are reduced, if not avoided. Additional control can be obtained by having the recessions 16 and protrusions 18 formed to be periodic over surface 14a of mold 14. As a result, the features transferred to imprinting layer 24 and subsequently etched into area A, i.e., vias 231, 241, 251 and 261, fully populate and are periodic in area A.

It should be noted that mold surface 14a may be formed with uniform period features having common shapes, as well as having differing shapes, as shown. Further, recessions 16 and protrusions 18 may be arranged on mold 14 to form virtually any desired geometric pattern. Exemplary patterns include a series of linear grooves/projections 80, a series of L-Shaped grooves/projections 82, a series of intersecting grooves/projections defining a matrix 84, and a series of arcuate grooves/projections 86. Additionally, pillars 88 may project from mold 14 and have any cross-sectional shape desired, e.g., circular, polygonal etc.

Additionally, it is desired not to employ features as part of the metrology standards that are located proximate to the edge of imprinting layer 24 and, therefore, area A. These features become distorted when transferred into substrate 10 during etching. The distortion is produced by edge-effects due to micro-loading, thereby exacerbating control of the feature dimensions.

Referring to FIGS. 7 and 8, in another embodiment of the present invention, further control of formation of vias 231, 241, 251 and 261 may be achieved by orientating the lattice structure of substrate 10 to ensure that sidewalls 231a, 241a, 251a and 261a are orientated to be substantially parallel to one of the crystal planes of the material from which the substrate 10 is formed. For example, substrate 10 may be fabricated so that the sidewalls 231a, 241a, 251a and 261a extend parallel to either of the 100, 010 or the 110 planes. This facilitates more precise control of the width $w_3$ of vias 231, 241, 251 and 261 in furtherance of uniformity of the same among all features formed in area A, particularly when features of imprinting layer 24 are transferred into substrate 10 using wet etch chemistries.

Referring to FIG. 1 in accordance with another embodiment of the present invention, to further provide greater control of the feature dimensions in imprinting layers 24, it has been found that the force F applied by mold 14 should be deminimus and only sufficient magnitude to facilitate contact with beads 25. The spreading of liquid in beads 25 should be attributable primarily through capillary action with mold surface 14a.

Referring to FIGS. 1, 2 and 4, the characteristics of material 25a are important to efficiently pattern substrate 10 in light of the unique deposition process that is in accordance with the present invention. As mentioned above, material 25a is deposited on substrate 10 as a plurality of discrete and spaced-apart beads 25. The combined volume of beads 25 is such that the material 25a is distributed appropriately over area of surface 12 where imprinting layer 24 is to be formed. As a result, imprinting layer 24 is spread and patterned concurrently, with the pattern being subsequently set by exposure to radiation, such as ultraviolet radiation. It is desired, therefore, that material 25a has certain characteristics to facilitate even spreading of material 25a in beads 25 over surface 12 so that the all thicknesses $t_1$ are substantially uniform and all thickness $t_2$ are substantially uniform and all widths, $w_1$, are substantially uniform. The desirable characteristics include having a suitable viscosity to demonstrate satisfaction with these characteristics, as well as the ability to wet surface of substrate 10 and avoid subsequent pit or hole formation after polymerization. To that end, in one example, the wettability of imprinting layer 24, as defined by the contact angle method, should be such that the angle, $\theta_1$, is defined as follows:

$$0 > \theta_1 < 75° \quad (4)$$

With these two characteristics being satisfied, imprinting layer 24 may be made sufficiently thin while avoiding formation of pits or holes in the thinner regions of imprinting layer 24.

Referring to FIGS. 2, 3, 4 and 5, another desirable characteristic that it is desired for material 25a to possess is thermal stability such that the variation in an angle Φ, measured between a nadir 30a of a recess 30 and a sidewall 30b thereof, does not vary more than 10% after being heated to 75° C. for thirty (30) minutes. Additionally, material 25a should transform to material 25c, i.e., polymerize and cross-link, when subjected to a pulse of radiation containing less than 5 J cm$^{-2}$. In the present example, polymerization and cross-linking was determined by analyzing the infrared absorption of the "C=C" bond contained in material 25a. Additionally, it is desired that substrate surface 12 be relatively inert toward material 25a, such that less than 500 nm of surface 12 be dissolved as a result sixty (60) seconds of contact with material 25a. It is further desired that the wetting of mold 14 by imprinting layer 24 be minimized, i.e., wetting angle, $\theta_2$, be should be of requisite magnitude. To that end, the wetting angle, $\theta_2$, should be greater than 75°.

The constituent components that form material 25a to provide the aforementioned characteristics may differ. This results from substrate 10 being formed from a number of different materials. As a result, the chemical composition of surface 12 varies dependent upon the material from which substrate 10 is formed. For example, substrate 10 may be formed from silicon, plastics, gallium arsenide, mercury telluride, and composites thereof. Additionally, substrate 10 may include one or more layers in region, e.g., dielectric layer, metal layers, semiconductor layer and the like.

Referring to FIGS. 2 and 3, in one embodiment of the present invention, the constituent components of material 25a consist of acrylated monomers or methacrylated monomers that are not silyated, a cross-linking agent, and an initiator. The non-silyated acryl or methacryl monomers are selected to provide material 25a with a minimal viscosity, e.g., viscosity approximating the viscosity of water (1-2 cps) or less. However, it has been determined that the speed of imprinting may be sacrificed in favor of higher accuracy in feature dimensions. As a result, a much higher viscosity material may be employed. As a result the range of viscosity that may be employed is from 1 to 1,000 centipoise or greater. The cross-linking agent is included to cross-link the molecules of the non-silyated monomers, providing material 25a with the properties to record a pattern thereon having very small feature sizes, on the order of a few nanometers and to provide the aforementioned thermal stability for further processing. To that end, the initiator is provided to produce a free radical reaction in response to radiation, causing the non-silyated monomers and the cross-linking agent to polymerize and cross-link, forming a cross-linked polymer material 25c. In the present example, a photo-initiator responsive to ultraviolet radiation is employed. In addition, if desired, a silyated monomer may also be included in material 25a to control the etch rate of the resulting cross-linked polymer material 25c, without substantially affecting the viscosity of material 25a.

Examples of non-silyated monomers include, but are not limited to, butyl acrylate, methyl acrylate, methyl methacrylate, or mixtures thereof. The non-silyated monomer may make up approximately 25% to 60% by weight of material 25a. It is believed that the monomer provides adhesion to an underlying organic transfer layer, discussed more fully below.

The cross-linking agent is a monomer that includes two or more polymerizable groups. In one embodiment, polyfunctional siloxane derivatives may be used as a cross-linking agent. An example of a polyfunctional siloxane derivative is 1,3-bis(3-methacryloxypropyl)-tetramethyl disiloxane. Another suitable cross-linking agent consists of ethylene diol diacrylate. The cross-linking agent may be present in material 25a in amounts of up to 20% by weight, but is more typically present in an amount of 5% to 15% by weight.

The initiator may be any component that initiates a free radical reaction in response to radiation, produced by radiation source 22, shown in FIG. 1, impinging thereupon and being absorbed thereby. Suitable initiators may include, but are not limited to, photo-initiators such as 1-hydroxycyclohexyl phenyl ketone or phenylbis(2,4,6-trimethyl benzoyl) phosphine oxide. The initiator may be present in material 25a in amounts of up to 5% by weight, but is typically present in an amount of 1% to 4% by weight.

Were it desired to include silylated monomers in material 25a, suitable silylated monomers may include, but are not limited to, silyl-acryloxy and silyl methacryloxy derivatives. Specific examples are methacryloxypropyl tris(tri-methylsiloxy)silane and (3-acryloxypropyl)tris(tri-methoxysiloxy)-silane. Silylated monomers may be present in material 25a in amounts from 25% to 50% by weight. The curable liquid may also include a dimethyl siloxane derivative. Examples of dimethyl siloxane derivatives include, but are not limited to, (acryloxypropyl) methylsiloxane dimethylsiloxane copolymer.

Referring to both FIGS. 1 and 2, exemplary compositions for material 25a are as follows:

COMPOSITION 1 n-butyl acrylate+(3-acryloxypropyltristrimethyl-siloxy)silane+1,3-bis(3-methacryloxypropyl)tetramethyldisiloxane

COMPOSITION 2 t-n-butyl acrylate+(3-acryloxypropyltristrimethyl-siloxy)silane+Ethylene diol diacrylate

COMPOSITION 3 t-butyl acrylate+methacryloxypropylpentamethyldisiloxane+1,3-bis(3-methacryloxypropyl)tetramethyldisiloxane The above-identified compositions also include stabilizers that are well known in the chemical art to increase the operational life, as well as initiators. Further, to reduce distortions in the features of imprinting layer 24 due to shrinkage of material 25a during curing, e.g., exposure to actinic radiation such as ultraviolet radiation, silicon nano-balls may be added to the material 25a either before patterning, e.g., before application of beads 25 to surface 12, or after application of beads 25 to surface 12.

Referring to FIGS. 1, 2 and 3, additionally, to ensure that imprinting layer 24 does not adhere to mold 14, surface 14a may be treated with a modifying agent. One such modifying agent is a release layer (not shown) formed from a fluorocarbon silylating agent. The release layer and other surface modifying agents, may be applied using any known process. For example, processing techniques that may include chemical vapor deposition method, physical vapor deposition, atomic layer deposition or various other techniques, brazing and the like. In this configuration, imprinting layer 24 is located between substrate 10 and release layer (not shown), during imprint lithography processes.

Figure 10:
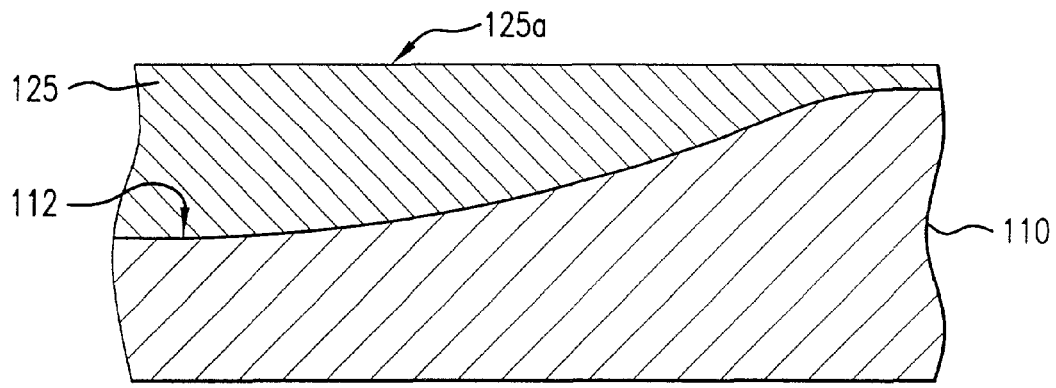
FIG. 10 is a detailed view of the imprinting layer shown in FIG. 4 using a planarization layer to overcome the non-planarity of the substrate, in accordance with a second embodiment of the present invention.

Referring to FIGS. 4 and 10, in some cases the non-planar topology of substrate 110 may frustrate deposition of an imprinting layer 24. This may be overcome by the use of a planarization layer 125. Planarization layer 125 functions to present a planar surface 125a to imprinting layer 124, shown more clearly in FIG. 11.

Figure 11:
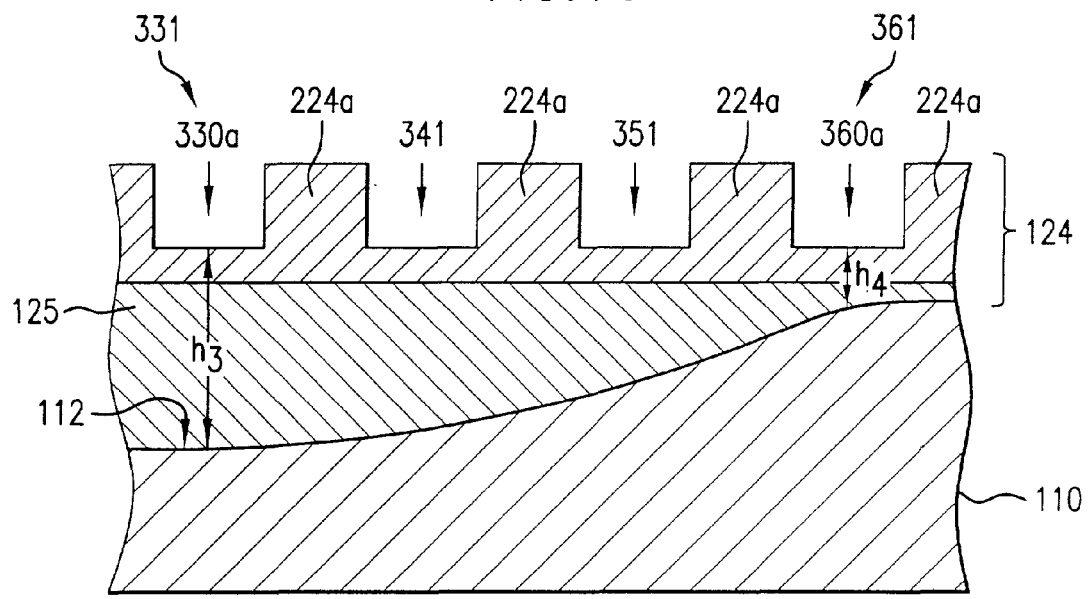
FIG. 11 is plan view of the substrate shown in FIG. 10, with a patterned imprinting layer being present.

Referring to both FIGS. 10 and 11, planarization layer 125 may be formed from a number of differing materials, such as, for example, thermoset polymers, thermoplastic polymers, polyepoxies, polyamides, polyurethanes, polycarbonates, polyesters, and combinations thereof. In the present example, planarization layer 125 is formed from an aromatic material so as to possess a continuous, smooth, relatively defect-free surface that may exhibit excellent adhesion to the imprinting layer 124. Specifically, surface 125a presents a planar region upon which imprinting layer 124 may be disposed and recesses 331, 341, 351 and 361 are formed.

Planarization layer 125 may be disposed on substrate 110 using any known deposition technique. In the present example, planarization layer 125 is disposed on substrate 110 using spin-on techniques. However, it was discovered that during etching, that the difference in height between nadirs 330a and 360a from surface 112, shown as $h_3$ and $h_4$, respectively, results in differing etch characteristics of vias formed into substrate 110, for the reasons discussed above. The height differential between surface nadir 330a and nadir 360a is defined as follows:

$$\Delta h' = |h_3 - h_4| \quad (5)$$

Figure 12:
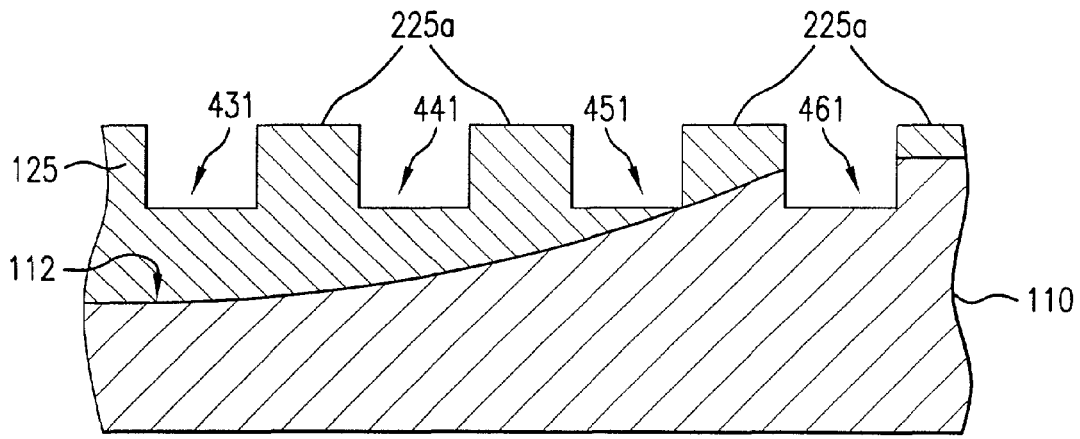
FIG. 12 is a plan view of the substrate shown in FIG. 11 after etching of the pattern into planarization layer.

Referring to both FIGS. 11 and 12, during the etching process, the features in imprinting layer 124, such as sub-portions 224a are transferred into both planarization layer 125 and substrate 110, forming sub-portions 225a. Spaced apart between sub-portions 225a are vias 431, 441, 451 and 461. Due to height differential $\Delta h'$ anisotropic etching occurs that distorts the features transferred into substrate 110 from imprinting layer 124, as discussed above. To avoid the problems presented by the height differential $\Delta h'$ the solutions described above may apply with equal weight here. An additional advantage with providing planarization layer 125 is that it may be formulated to compensate for the anisotropicity of the etch that occurs due to the height differential, $\Delta h$, defined by equation 1. As a result, planarization layer may be employed to reduce, if not overcome, the deleterious effects of the height differential, $\Delta h$, defined by equation 1.

The embodiments of the present invention described above are exemplary. Many changes and modifications may be made to the disclosure recited above, while remaining within the scope of the invention. For example, as mentioned above, many of the embodiments discussed above may be implemented in existing imprint lithography processes that do not employ formation of an imprinting layer by deposition of beads of polymerizable material. Exemplary processes in which differing embodiments of the present invention may be employed include a hot embossing process disclosed in U.S. Pat. No. 5,772,905, which is incorporated by reference in its entirety herein. Additionally, many of the embodiments of the present invention may be employed using a laser assisted direct imprinting (LADD) process of the type described by Chou et al. in *Ultrafast and Direct Imprint of Nanostructures in Silicon*, Nature, Col. 417, pp. 835-837, June 2002. Therefore, the scope of the invention should be determined not with reference to the above description, but instead should be determined with reference to the appended claims along with their full scope of equivalents.

What is claimed is:

1. A method of arranging features, on a substrate having topological variations, to replicate features having minimal dimensional variability, said method comprising:
   forming a volume of flowable material on a region of said substrate, said region having an area associated therewith;
   forming, from said volume of flowable material, a plurality of features on said region; and
   transferring said plurality of features into said substrate, defining transferred features, with said area of said region being established to maximize a planarity of said region in a first direction to minimize dimensional variations among a subset of said transferred features in a second direction orthogonal to said first direction.

2. The method as recited in claim 1 wherein forming said plurality of features further includes arranging said plurality of features to be periodic over said region, with each of said plurality of features having a geometric pattern selected from a set of patterns consisting essentially of arcuate shapes, L-shapes and linear shapes.

3. The method as recited in claim 2 wherein forming said volume of said flowable material further includes depositing a bead of said flowable material onto said substrate and forming said plurality of features further includes contacting said bead with a mold having a relief structure on a surface thereof to spread said bead over said region, imprinting said plurality of features therein and further including subjecting said flowable material to conditions to polymerize said flowable material, forming a polymerized layer.

4. The method as recited in claim 3 wherein forming said plurality of features further includes forming said plurality of features on said region to have first and second sets of said linear shapes, with said first set intersecting said second set and extending orthogonally thereto to define a matrix pattern.

5. The method as recited in claim 3 wherein forming said plurality of features further includes forming said plurality of features on said region as a plurality of spaced-apart projections having a cross-sectional shape from a set of shapes consisting essentially of polygonal and circular.

6. The method as recited in claim 5 wherein all of said plurality of features have a common shape.

7. The method as recited in claim 1 wherein said substrate includes a lattice structure having crystalline planes with said plurality of features including a sidewall orientated to extend parallel to a subset of said crystalline planes.

8. The method as recited in claim 1 wherein said region includes an edge, wherein forming said plurality of features further includes forming said plurality of features so as to be absent from portions of said region proximate to said edge.

9. A method of arranging features on a substrate to replicate features having minimal dimensional variability, said method comprising:
forming a volume of flowable material on a region of said substrate, said region having an area associated therewith;
forming, from said volume of said flowable material, a plurality of features on said region, said plurality of features comprising first and second subsets having first and second thicknesses, with a magnitude of said volume of said flowable material being defined by said area, said first and second thicknesses, and a fill factor associated with one of said first and second subsets; and
transferring said plurality of features into said substrate, defining transferred features, with said area of said region being established to maximize a planarity of said region to minimize dimensional variations among a subset of said transferred features.

10. The method as recited in claim 9 wherein forming said plurality of features further includes said magnitude of said volume of said flowable material being defined by:

$$A \times [t_2 + (f \times t_1)]$$

wherein A is said area, $t_1$ is said first thickness, $t_2$ is said second thickness, and f is said fill factor.

11. The method as recited in claim 10 wherein forming said plurality of features further includes defining said fill factor to be a percentage of said region comprising said first subset of said plurality of features.

12. The method as recited in claim 1 further includes minimizing thickness variations among a subset of said plurality of features.

13. The method as recited in claim 1 includes minimizing a magnitude of said area.

14. The method as recited in claim 1 wherein forming said volume of flowable material further includes positioning said region upon said substrate to maximize said planarity of said region.

* * * * *